(12) United States Patent
Cruchon-Dupeyrat et al.

(10) Patent No.: US 7,199,305 B2
(45) Date of Patent: Apr. 3, 2007

(54) PROTOSUBSTRATES

(75) Inventors: Sylvain Cruchon-Dupeyrat, Chicago, IL (US); Michael Nelson, Libertyville, IL (US); Jeff Rendlen, Chicago, IL (US); Joseph Fragala, San Jose, CA (US)

(73) Assignee: NanoInk, Inc., Chicago, IL (US)

( * ) Notice: Subject to any disclaimer, the term of this patent is extended or adjusted under 35 U.S.C. 154(b) by 163 days.

(21) Appl. No.: 10/444,061

(22) Filed: May 23, 2003

(65) Prior Publication Data

US 2004/0026681 A1   Feb. 12, 2004

Related U.S. Application Data

(60) Provisional application No. 60/401,773, filed on Aug. 8, 2002.

(51) Int. Cl.
*H05K 1/16* (2006.01)
(52) U.S. Cl. .................. 174/260; 977/721; 977/722; 977/723; 977/724
(58) Field of Classification Search .............. 174/260, 174/261; 977/707, 712, 721–724, 755, 762, 977/780–782, 784, 799
See application file for complete search history.

(56) References Cited

U.S. PATENT DOCUMENTS

| | | | |
|---|---|---|---|
| 4,130,334 A | 12/1978 | Anderson | |
| 4,833,404 A | 5/1989 | Meyer et al. | |
| 4,854,039 A | 8/1989 | Wendt | |
| 4,862,076 A * | 8/1989 | Renner et al. | 324/755 |
| 4,949,453 A | 8/1990 | Neumann | |
| 4,978,912 A | 12/1990 | Vonder | |
| 4,991,287 A | 2/1991 | Piatt | |
| 5,090,121 A | 2/1992 | Gaddis | |
| 5,122,620 A | 6/1992 | Neumann | |
| 5,226,824 A | 7/1993 | Karlovich | |
| RE34,395 E | 10/1993 | Neumann | |
| 5,258,576 A | 11/1993 | Neumann | |
| 5,362,669 A | 11/1994 | Boyd et al. | |
| 5,426,738 A | 6/1995 | Hsieh | |
| 5,665,618 A * | 9/1997 | Meyer et al. | 438/172 |
| 5,686,699 A * | 11/1997 | Chu et al. | 174/52.4 |
| 5,728,507 A | 3/1998 | Rhoades | |

(Continued)

FOREIGN PATENT DOCUMENTS

GB      2267997 A      12/1993

(Continued)

OTHER PUBLICATIONS

International Search Report dated Mar. 12, 2003.

(Continued)

*Primary Examiner*—Dean A. Reichard
*Assistant Examiner*—Yuriy Semenenko
(74) *Attorney, Agent, or Firm*—Foley & Lardner LLP

(57) ABSTRACT

The invention provides a nanolithographic protosubstrate adapted for nanolithographic formation of nanostructures on the protosubstrate comprising: a substrate having a top surface exposed for nanolithographic formation of nanostructures, wherein the top surface comprises: electrically insulating surface regions; and at least one discreet electrode topology surrounded by the electrically insulating surface regions, wherein the electrode topology is adapted with electrical interconnections for electrically coupling the electrode topology to an external device.

56 Claims, 20 Drawing Sheets

U.S. PATENT DOCUMENTS

| | | | |
|---|---|---|---|
| 5,734,560 A * | 3/1998 | Kamperman et al. | 361/774 |
| 5,780,358 A | 7/1998 | Zhou et al. | |
| 5,972,798 A | 10/1999 | Jang et al. | |
| 6,043,563 A | 3/2000 | Elridge | |
| 6,131,275 A | 10/2000 | Eriksson | |
| 6,140,710 A | 10/2000 | Greenberg | |
| 6,215,196 B1 | 4/2001 | Elridge | |
| 6,325,904 B1 * | 12/2001 | Peeters | 257/414 |
| 6,358,816 B1 | 3/2002 | Singh | |
| 6,366,107 B2 | 4/2002 | Swart | |
| 6,391,792 B1 | 5/2002 | Jang et al. | |
| 6,429,458 B1 * | 8/2002 | Weigold et al. | 257/69 |
| 6,433,423 B2 | 8/2002 | Bergstedt | |
| 6,452,406 B1 | 9/2002 | Beaman et al. | |
| 6,468,891 B2 | 10/2002 | Williams | |
| 6,509,207 B1 | 1/2003 | Liu | |
| 6,524,123 B2 | 2/2003 | Kedrowski | |
| 6,555,415 B2 | 4/2003 | Hedler et al. | |
| 6,559,523 B2 | 5/2003 | Schmid et al. | |
| 6,561,411 B2 | 5/2003 | Lee | |
| 6,563,225 B2 | 5/2003 | Soga et al. | |
| 6,619,785 B1 * | 9/2003 | Sato | 347/50 |
| 6,635,311 B1 | 10/2003 | Mirkin et al. | |
| 6,642,129 B2 | 11/2003 | Liu et al. | |
| 6,644,117 B1 * | 11/2003 | Kueck et al. | 73/488 |
| 6,673,532 B2 | 1/2004 | Rao | |
| 6,674,074 B2 | 1/2004 | Schwartz et al. | |
| 6,737,646 B2 | 5/2004 | Schwartz et al. | |
| 6,751,856 B2 | 6/2004 | Kedrowski | |
| 6,827,979 B2 | 12/2004 | Mirkin et al. | |
| 6,829,749 B2 | 12/2004 | Osaka | |
| 2002/0061662 A1 * | 5/2002 | Boggild | 438/800 |
| 2002/0122373 A1 * | 9/2002 | Marshall | 369/101 |
| 2002/0122873 A1 | 9/2002 | Mirkin et al. | |
| 2003/0068446 A1 | 4/2003 | Mirkin et al. | |
| 2003/0123199 A1 * | 7/2003 | Honda et al. | 360/324 |
| 2003/0162004 A1 | 8/2003 | Mirkin et al. | |
| 2003/0185967 A1 | 10/2003 | Eby et al. | |
| 2004/0045738 A1 * | 3/2004 | Sugawa et al. | 174/262 |

FOREIGN PATENT DOCUMENTS

| | | |
|---|---|---|
| WO | WO 00/41213 A1 | 7/2000 |
| WO | WO 01/91855 A1 | 12/2001 |

OTHER PUBLICATIONS

U.S. Appl. No. 10/307,515, filed Dec. 2, 2002, Mirkin et al.
U.S. Appl. No. 10/375,060, filed Feb. 28, 2003, Dupeyrat et al.
Madou, *Fundamentals of Microfabrication, The Science of Miniaturization, Second Edition*, CRC Press, USA, Chapters 1, 2, 3, & pp. 602-604, (2002).

* cited by examiner

PROTOSUBSTRATES

CROSS-REFERENCE TO RELATED APPLICATIONS

This application claims benefit of provisional patent application Ser. No. 60/401,773 filed Aug. 8, 2002 to Cruchon-Dupeyrat et al. ("Integrated Computer-Assisted Design of Nanometer-scale Patterns and their Fabrication using a Combination of Multiple Types of (Nano)lithography Techniques"), the complete disclosure of which is hereby incorporated by reference.

BACKGROUND

Current progress in miniaturization, nanotechnology, and nanolithography is not only limited by the scientific community's ability to put ideas into action. It can also be limited by the ability to test those new ideas and furthermore to test the actual devices that are fabricated from the bottom up. In the case of nano-scale electronic device fabrication, it can be difficult to integrate the nanoscale components with traditional microscale testing environments. Commercially available, systematically structured devices for application and testing of nanoscale experiments are generally unavailable. Rather, researchers are forced to design photomasks and fabricate their own substrates and to use expensive electron beam equipment to build circuit test rigs.

In addition to academic research, a commercial need exists for researchers and engineers to better understand small scale circuits, be they microcircuits or nanocircuits. For example, an important segment of commercial nanotechnology is the rapidly developing ability to generate nanocircuitry through use of nanotubes, nanowires, nanorods, and other nanostructures including those having semi-conducting and conducting electrical properties. Carbon nanotubes are of particular interest. Once these nanocircuits are formed, however, a commercial need exists for connecting the nanocircuitry to the larger world, especially existing methods used to test circuits. For example, electrical measurements on the nanostructures and their nanocircuits are needed which are compatible with existing technology. It can be difficult, however, to connect the larger world of electrical measurements with small-scale circuits, particularly nanocircuits, using existing technology which is readily available. A strong commercial need exists, therefore, for devices to solve this problem in practical, commercial engineering as well as academic research.

Small-scale circuits, including nanocircuitry, can be formed by lithography including nanolithography. One important lithographic method is the direct-write type being developed at Northwestern University and NanoInk, Inc. under the proprietary trademark, DIP PEN NANOLITHOGRAPHY™ (DPN™) printing. In this direct-write nanolithographic method, a tip is used to deposit a patterning ink on a substrate, forming a stable nanostructure. Any devices developed for electrical measurements on nanocircuitry should, if possible, be compatible with nanolithgraphic methods. For example, value is increased if a nanocircuit can be formed on a substrate by nanolithography and then the electrical characteristics can be measured directly on the same device used for the nanolithography. A need exists for better, lithography substrates which provide for measurements of the nanostructures formed on the substrate.

The present invention defines a sample substrate tool which enables the nanotechnologist, whether engaged in academic research or commercial production, to systematically build nanoscale devices and then seamlessly test them in situ.

SUMMARY

The present invention provides multiple embodiments. Although this section summarizes the invention, this section should not be used to judge the scope of the invention.

In one embodiment, the invention provides a nanolithographic protosubstrate adapted for nanolithographic formation of nanostructures on the protosubstrate comprising: a substrate having a top surface exposed for nanolithographic formation of nanostructures, wherein the top surface comprises: electrically insulating surface regions; and at least one discreet electrode topology surrounded by the electrically insulating surface regions, wherein the electrode topology is adapted with electrical interconnections for electrically coupling the electrode topology to an external device.

In another embodiment, the invention provides a nanolithographic protosubstrate adapted for nanolithographic formation of nanostructures on the protosubstrate consisting essentially of: a substrate having a top surface exposed for nanolithographic formation of nanostructures, wherein the top surface comprises: electrically insulating surface regions; and at least one discreet electrode topology surrounded by the electrically insulating surface regions, wherein the electrode topology is adapted with electrical interconnections for electrically coupling the electrode topology to an external device.

In another embodiment, the present invention provides an article comprising: (A) a nanolithography substrate having a top surface comprising: electrically insulating surface regions; a plurality of different electrically conductive electrode topologies on the substrate surface separated by the electrically insulating surface regions, wherein the topologies comprise electrodes, traces, and conductive pads, (B) a chip carrier on which the substrate is anchored.

In another embodiment, the present invention comprises a nanocircuit interconnection board comprising: (a) a substrate; (b) an electrode topology formed on the substrate including a nanolithographic patterning region for one or more nanoscale electronic circuit elements; and (c) at least one electrical interconnection for electrically coupling the electrode topology to an external device.

The invention also provides a kit for nanolithography comprising: a substrate carrier assembly, and a connector access module, wherein the substrate carrier assembly is adapted to fit into the connector access module.

Advantages of the invention include facile and versatile measurements of electrical characteristics of nanostructures. Another advantage of the invention is that the electrode topology can be prepared with use of computer aided design lithography software which can be integrated with the additional software for conducting the nanolithography.

The invention, in sum, provides a rationally constructed pattern of microscale or nanoscale electrodes on a substrate which make up a variety of electronic testing configurations. The substrate is integrated with scalable interconnect components that will facilitate the nano-to-microscale transition in subcomponent connectivity. The transitional integration provides convenient testing. The invention can be used to facilitate the testing of nanofabricated devices by direct-write nanolithographic printing, but can also be used for a variety of nano-electronics testing scenarios such as, for example, testing nanotube conductivity after fabrication and growth.

DETAILED DESCRIPTION

Provisional application serial No. 60/401,773 filed Aug. 8, 2002 to Cruchon-Dupeyrat et al. is part of the present disclosure and is hereby incorporated by reference.

Background MEMS and nanotechnology information useful for practice of the present invention can be found in, for example, Marc J. Madou, *Fundamentals of Microfabrication, The Science of Miniaturization*, 2$^{nd}$ Ed., CRC Press, 2002. For example, chapter 1 describes lithography, chapters 2 and 3 define pattern transfers, and an open electrophoretic DNA hybridization chip is described on pages 602–604.

The text, *Microelectronic Circuits*, 4$^{th}$ Ed., by Sedra/Smith (Oxford, 1998) can be used to practice the present invention. For example, Appendix A describes VLSI fabrication technology including the IC fabrication steps of wafer preparation, oxidation, diffusion, ion implantation, chemical vapor deposition, metallization, photolithography, and packaging (including dicing and connections to pins to metallization patterns by fine gold wires). Other references include R. S. Muller and T. I. Kamins, *Device Electronics for Integrated Circuits*, 2$^{nd}$ Ed., New York, John Wiley, 1986 and W. R. Runyan and K. E. Bean, *Semiconductor Integrated Circuit Processing Technology*, New York, Addison Wesley, 1990.

Prototype circuit boards are known in the art, and the following representative references can be used in the practice of the present invention: U.S. Pat. No. 4,854,039 to Wendt describes background for prototype circuit boards; U.S. Pat. No. 4,991,287 to Piatt describes fabrication of prototype circuit boards; U.S. Pat. No. 4,130,334 to Anderson describes use of prototype circuit boards; U.S. Pat. No. 5,090,121 to Gaddis describes formation of protoype circuit boards; U.S. Pat. No. 6,131,275 to Eriksson describes prototype circuit boards; U.S. Pat. No. 5,426,738 to Hsieh describes prototype circuit boards; US patent publication 2001/0011901 to Swart describes testing of prototype circuit boards; US patent publication 2001/0036718 to Williams describes fabrication of prototype circuit boards; US patent publication 2003/0092300 to Kedrowski describes connections to prototype circuit boards; US patent publication 2003/0074638 to Osaka describes use of prototype circuit boards; US patent publication 2002/0025547 to Rao describes use of prototype circuit boards; and US patent publication 2002/0098728 to Kedrowski describes connections to prototype circuit boards.

Figure 1:
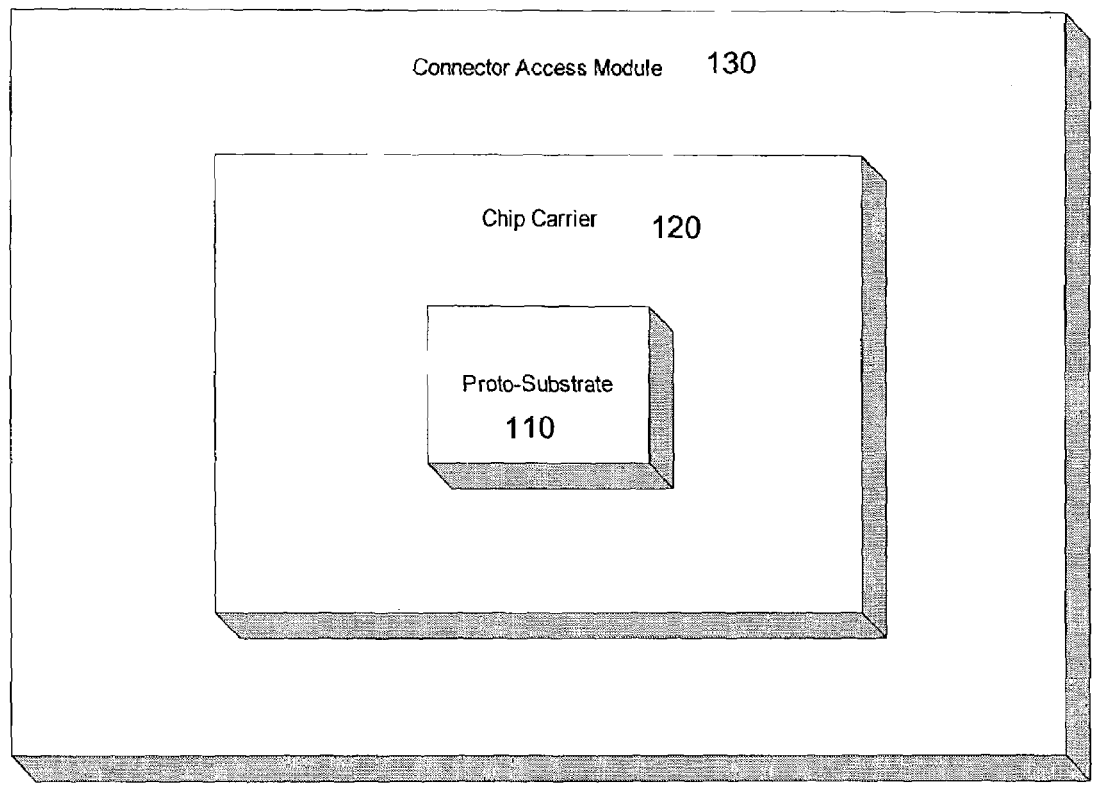
FIG. 1 illustrates schematically the relationship of the protosubstrate, chip carrier, and connector access module.

FIG. 1 illustrates three elements of the present invention: a protosubstrate (110), a chip carrier (120), and a connector access module, CAM (130). All three elements can be integrated in a single device or kit for use in connecting the nanoscopic domain to the microscopic and macroscopic domain. In a preferred embodiment, nanostructures and nanocircuit elements are introduced on the protosubstrate, and their electrical characteristics can be measured with use of external devices attached to the CAM via the chip carrier.

Figure 2:
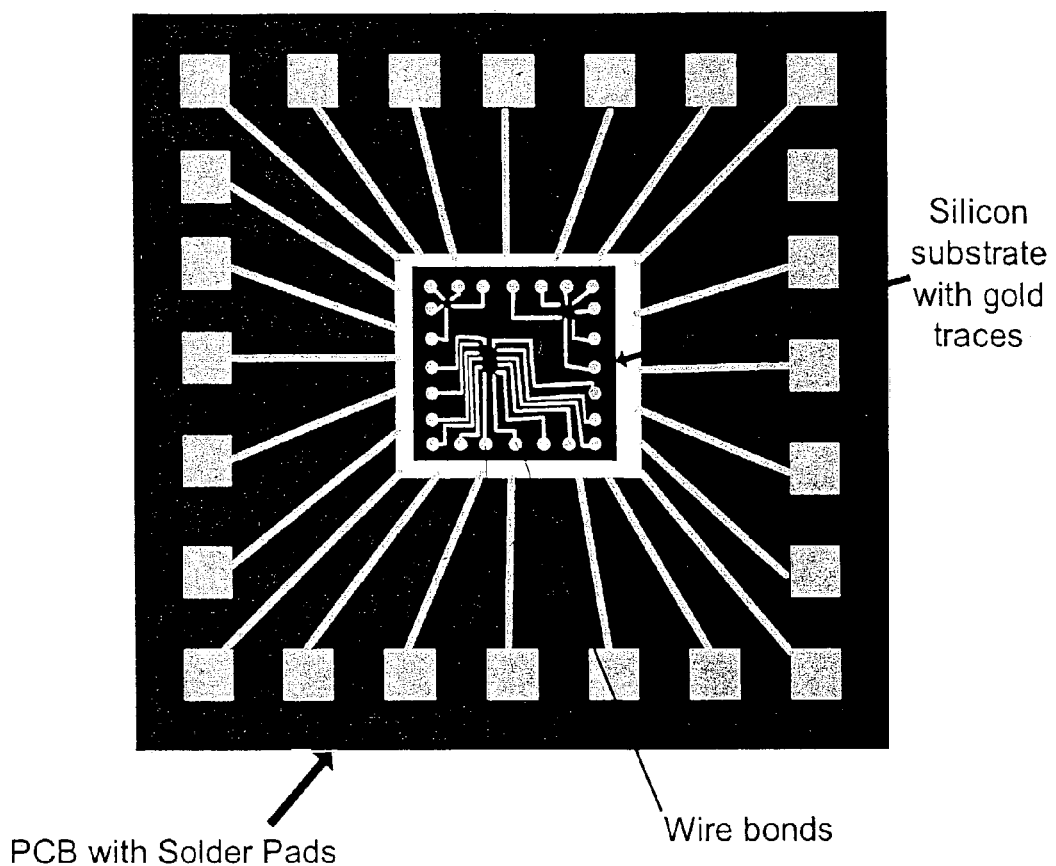
FIG. 2 illustrates a top view of one embodiment comprising a silicon substrate with gold traces, and wire bonding of the protosubstrate to a PCB with solder pads.

The protosubstrate and chip carrier elements can be connected, used, and disposed, if desired, as a single, combined disposable unit. This combined unit can be called a "substrate carrier assembly" (SCA) (140), and one embodiment of the SCA is shown in FIG. 2. The CAM can be reversibly connected to the SCA by methods, including mechanical methods, and can be reused after the substrate carrier assembly is disposed. FIG. 2 illustrates an embodiment, showing the substrate wire bonded to the chip carrier to form the substrate carrier assembly. The substrate can be, for example, a silicon substrate with gold traces. The chip carrier can be a printed circuit board with solder pads. Wire bonding, for example, can be used to connect the solder pads with the conductive pads of the substrate.

FIG. 2 provides a top view of a substantially planar structure, which can be defined as perpendicular X and Y directions. The Z direction can be defined as emerging perpendicularly from the plane of the paper.

The protosubstrate can be prepared by methods known in the art for prototype circuit board, integrated circuit, and microelectrode array manufacture. It is advantageously used as a nanocircuit interconnection board. The protosubstrate comprises a substrate having a surface in the X and Y plane. The top surface can further comprise a flood plane ground, which can be a conductive layer comprising conductive material. The conductive material can be the same conductive material as the electrodes. The flood plane ground can be on the same Z plane and can be separated from the electrode topologies by an insulated separation. In known PCBs, this insulation can be an air gap, but in the present invention, it can be a silicon oxide separation. If desired, the flood plane can be biased so that it is not grounded but set at a reference voltage.

Figure 3:
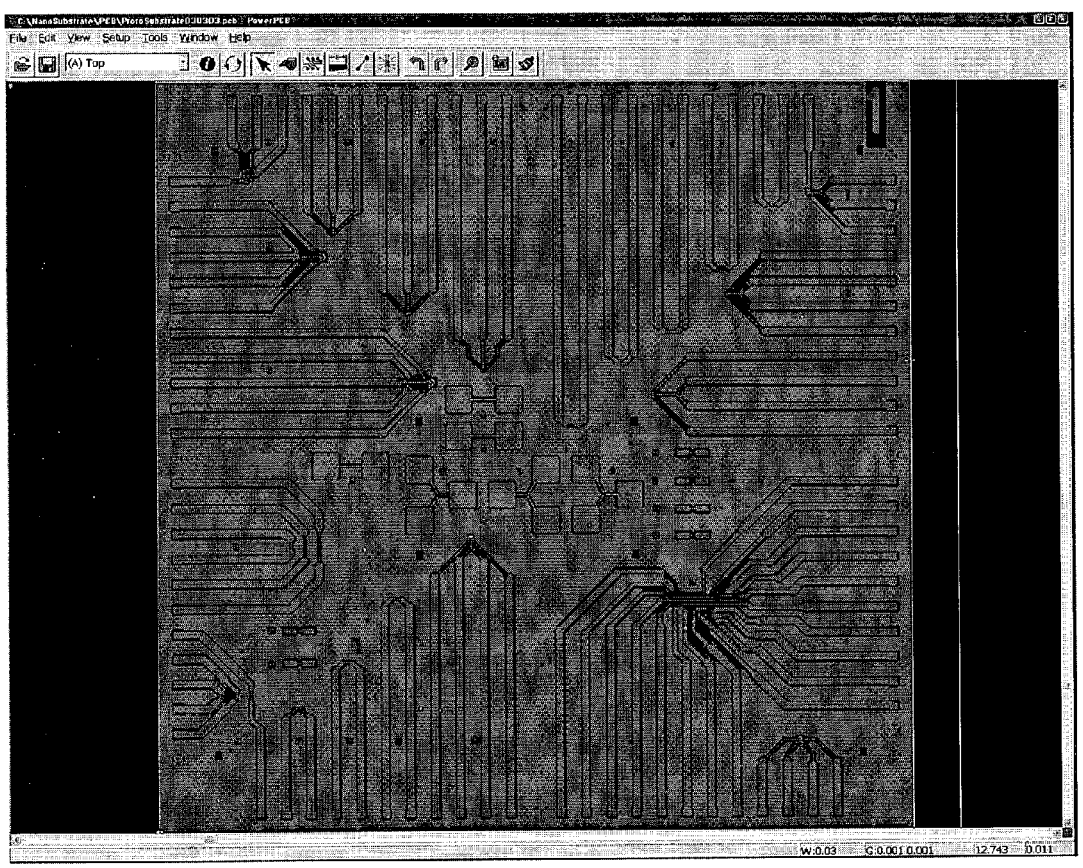
FIG. 3 illustrates another embodiment of the invention, showing a top view of a group of discreet electrode topologies on the protosubstrate including use of flood plane.
Figure 4:
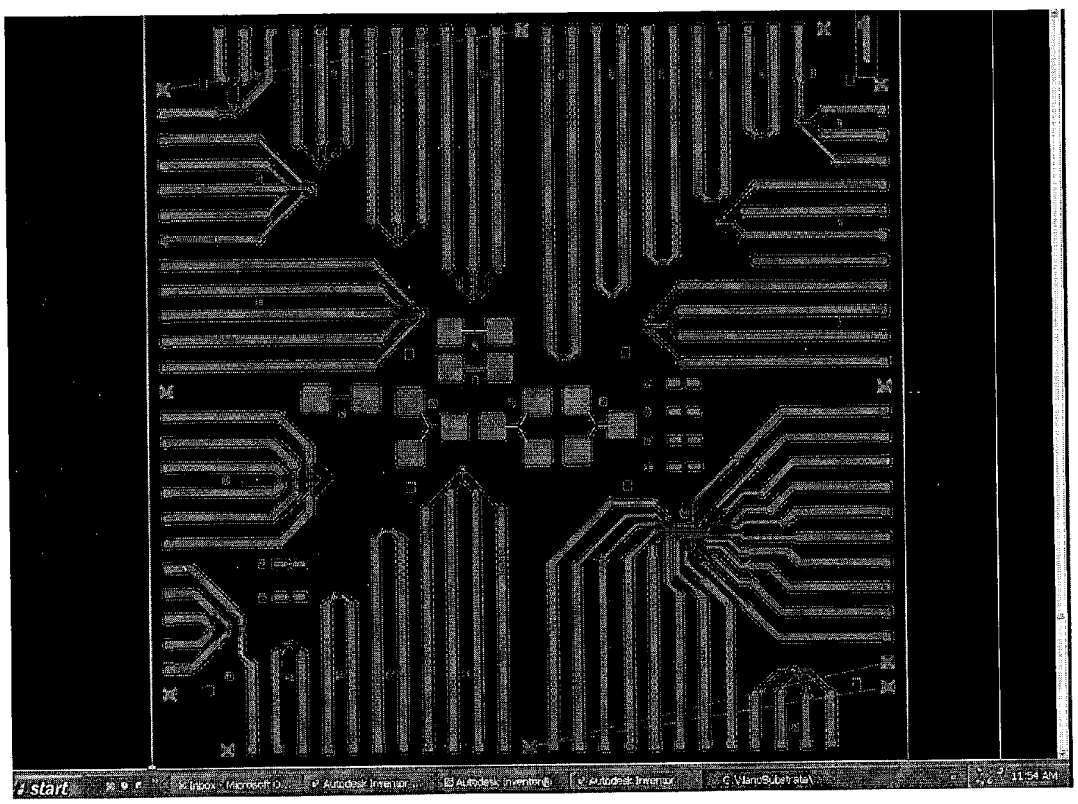
FIG. 4 illustrate another embodiment of the invention, showing a top view of a group of electrode topologies on the protosubstrate without use of flood plane.
Figure 5:
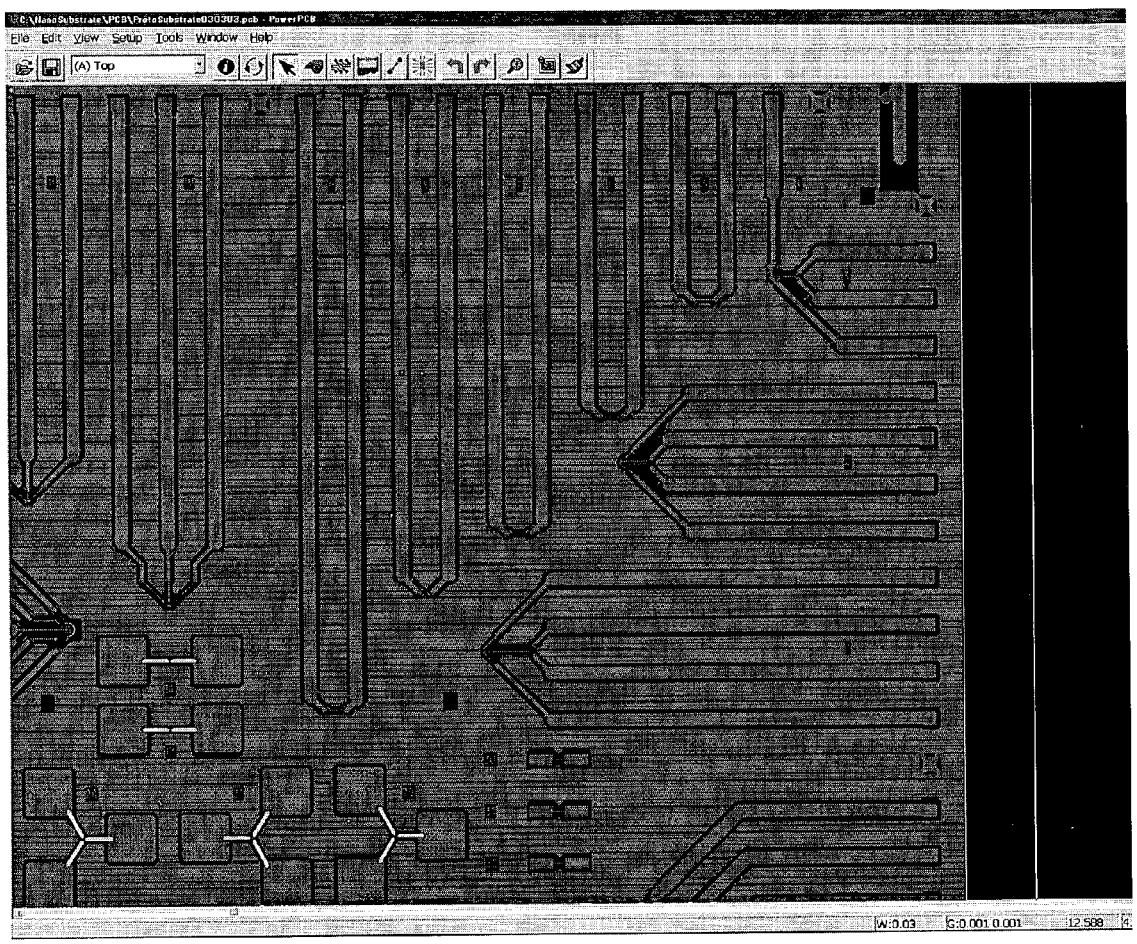
FIG. 5 illustrates a closer, quadrant top view of a group of electrode topologies on the protosubstrate.

The substrate has a top surface in the X and Y plane which is exposed for lithographic formation of nanostructures and presents circuit topologies. Representative top surfaces are shown in FIGS. 3–5, including use of flood plane (FIG. 3) and no flood plane (FIG. 4). By methods known in the art, the surface can be segmented into different functional regions. For example, the top surface comprises electrically insulating regions. The top surface also comprises electrically conductive regions. The electrically conductive regions form at least one discreet electrode topology which is surrounded by the electrically insulating regions. The electrode topology can be adapted for microscale measurement of electrical characteristics of one or more nanostructures which contact the electrode upon their nanolithographic formation on the top surface.

In a preferred embodiment, the electrically conductive surface regions can be substantially flat and coplanar with each other. They can define a circuit plane in the X-Y directions.

In addition, the electrically insulating surface regions also can be substantially flat and coplanar with each other. They can define an insulating plane, also in the X-Y directions.

The substantially flat and coplanar electrically conductive surface regions can be higher in the Z direction than the substantially flat and coplanar electrically insulating surface regions, and an average height in the Z direction can be determined between the two planes. For example, they can be about 1,000 nm or less in height above the electrically insulating surface regions. More particularly, they can be about 100 nm or less in height above the electrically insulating surface regions. Even more particularly, they can be about 10 nm or less in height above the electrically insulating surface regions.

If desired, the electrically conductive surface regions and the electrically insulating surface regions can be substantially coplanarized by methods known in the art. For example, chemical mechanical polishing (CMP) can be used to reduce the height of the electrically conductive surface regions to the height of the electrically insulating surface regions. CMP methods are known in the art, but a preferred type of CMP can be carried out by Cabot CMP (Cabot Microelectronics Corp., 870 N. Commons Dr., Aurora, Ill., 60504). Patent literature describing CMP includes: U.S. Pat. No. 5,362,669 to Boyd et al; U.S. Pat. No. 5,780,358 to Zhou et al.; U.S. Pat. No. 6,391,792 to Jang et al.; U.S. Pat. No. 5,728,507 to Rhoades; U.S. Pat. No. 5,972,798 to Jang et al.; and U.S. Pat. No. 6,358,816 to Singh.

In another embodiment, the electrically conductive surface regions can be lower than the electrically insulating surface regions. For example, they can be about 1,000 nm or less in height below the electrically insulating surface regions. More particularly, they can be about 100 nm or less in height below the electrically insulating surface regions. Even more particularly, they can be about 10 nm or less in height below the electrically insulating surface regions.

The composition of the electrically conductive surface regions is not particularly limited provided that good conductivity is provided. It can comprise metals including aluminum, gold, and silver. It can comprise polymers including conductive polymers.

The compositions of the electrically insulating surface regions is not particularly limited provided that electrical insulation is present. For example, it can comprise an oxide including metallic oxides. Other insulator examples include spin-on glass (SOG), glass, quartz, or a spun polymer. It can be a group IV metal oxide such as silicon dioxide. It can be a group IV compound such as silicon, electrically insulated by, for example, a silicon oxide, silicon nitride, or polyimide layer.

In a preferred embodiment, the electrically conductive surface regions are metallic and the electrically insulating surface regions are metal oxide. More specifically, the electrically conductive surface regions are gold and the electrically insulating surface regions are silicon dioxide, and the silicon dioxide can overlay silicon. Gold regions can be placed on the silicon dioxide by photolithographic methods.

The size and shape of the substrate is not particularly limited. For example, it can be rectangular, square, or circular. It can be characterized by a length and a width, wherein the length is about 25 mm or less and the width is about 25 mm or less. It can also be about 12 mm or less in width and length. The size can be adapted for the number of electrode topologies included on a single substrate.

In one embodiment for fabrication of the protosubstrate, a {110} silicon wafer can be oxidized by known methods such as heating at high temperature (900–1200° C.) in an atmosphere containing oxygen or water vapor. A thick photoresist can be spin-coated on the wafer and patterned with a negative image of the desired electrode pattern. Then, a Cr/Au/Cr metal sandwich structure can be deposited by known methods (chromium or titanium can be used as an adhesion layer; gold can be used as the main conductor; and chromium can be used as a polish stop layer, applied by sputtering). Excess metal can be lifted off the surface. Then, silicon oxide can be deposited by known methods (e.g., low temperature silicon dioxide can be deposited in a CVD furnace or a plasma-enhanced CVD reactor using a silane/oxygen mixture or a tetraorthosilicate source). Next, a CMP step can be done to polish down to the Cr polish top (when the metal is apparent), and the residual Cr can be etched by known methods (e.g., $Ce(NH_4)(NO_3)_6$:$HCl_4$ solution. Then, touch up CMP polishing of oxide can be carried out by known methods to further reduce height differences between metal and surrounding insulator. Finally, a dicing step can be carried out.

If an optically transparent protosubstrate is desired, a Pyrex wafer can be used instead of silicon. The wafer can be optionally coated with resist to protect it from contamination until use, or the exposed metal and silicon dioxide surfaces can be modified in preparation for nanolithography. For example, silanization can be carried out by exposure to an alkyltrichlorosilane solution.

The electrode topology comprises features. For example, the electrode topology generally comprises electrode structures in a pattern. The electrode topology also generally comprises trace structures in combination with the electrode structures. The electrodes can be microelectrodes or nanoelectrodes. The electrodes can be elongated with a length and a width, wherein the width is about 5 microns or less and the length is about 15 microns or less. The traces can be elongated with one dimension in the X-Y plane being much longer than the other. For example, a length can be about 6 mm or less. The traces can be about 110 microns wide or less.

One skilled in the art can determine which part of the electrically conductive structure is an electrode and which part of the electrically conductive structure is a trace. While distinct electrodes and traces are depicted in the various figures and described in the various embodiments, the electrodes and traces can be combined, forming an integral unit for some applications. For example, an electrode can be formed as an end portion of a given trace, or may be a separate entity electrically coupled to a given trace. As such, the electrodes can be formed of the same material or different materials as the traces, and/or may be formed on the same layer or different layers as the traces. Thus, the present invention is not intended to be limited by the distinct and separate electrode. The final electrode topology can be formed by other processes, such as for example electron beam lithography or other direct-write lithographic methods.

In general, the electrode features and traces can be designed with symmetry. This can help ensure that any characteristics of the topology will minimally influence the measurements.

Electrical engineering design known in the art can be used in making the features thick, symmetric, and with low impedance. The electrodes and traces can be as wide as possible to reduce the sheet resistance of the features.

The electrode topology can be adapted with electrical interconnections for electrically coupling the electrode topology to an external device. The electrode topology, for example, can further comprise electrically conducting pads adapted for electrical communication and connection with matching connectors or pads of a chip carrier such as a printed circuit board. For example, these conducting pads are also exposed on the top surface of the substrate. The height of the pads can be, for example, about one micron or less. They can be adapted for bonding to the chip carrier by means such as wire bonding. The conducting pads can be disposed near an outer edge of the substrate. They can be about 50 microns for example, from the outer edge.

In addition, the electrode topology can comprise electrically conductive pads which are adapted for contact with externally introduced microprobes. These can be called unconnected pads because they are not designed for use in connection with the chip carrier.

The electrode topology can also comprise, if desired, a guard-band/flux inducing loop.

The number of discreet electrode topologies is not particularly limited. For example, the protosubstrate can comprise at least one, or at least 7 discreet electrode topologies on the protosubstrate base. Or it can comprise at least 10, or at least 30, or at least 100, or at least 1,000 discreet electrode topologies.

A single type of electrode topology can be used repeatedly on the substrate. For example, several of the first electrode topologies, described below, can be used on a single substrate. Preferably, at least six different types of topology are used on a single substrate to increase efficiency. Different electrode topologies are now described.

Figure 6:
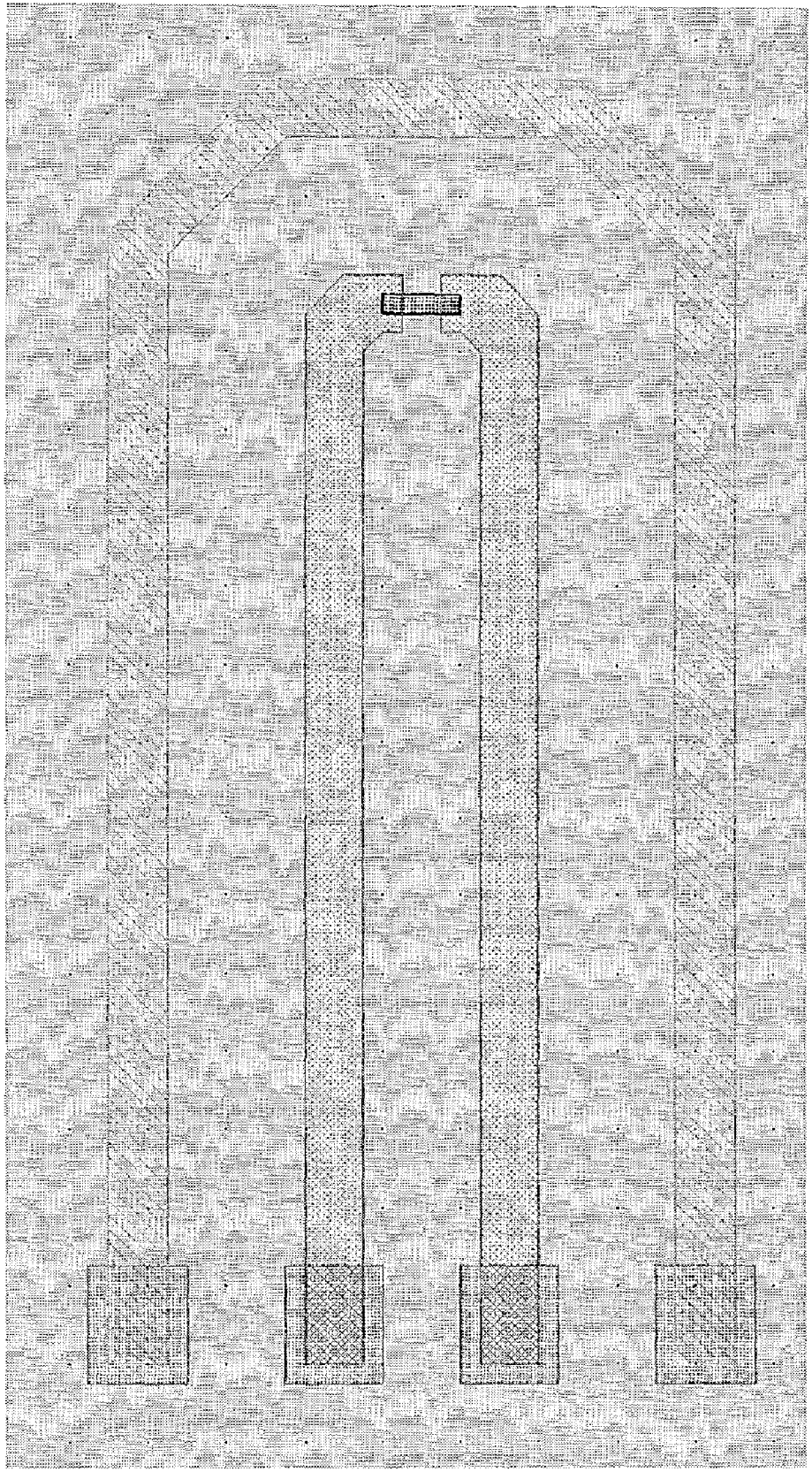
FIG. 6 illustrates a first electrode topology with one electrode and two traces. Guard-band/flux inducing loop is present.

A number of exemplary electrode topologies are now described. FIG. 6 illustrates a first electrode topology. It comprises a single electrode with two traces. These traces can be used for different purposes. For example, one trace can be adapted for sensing and other trace can be adapted for an active bias. The two traces can be substantially straight, substantially parallel, and symmetrically disposed with respect to a plane of symmetry which is perpendicular to the top surface and which intersects the electrode.

Figure 7:
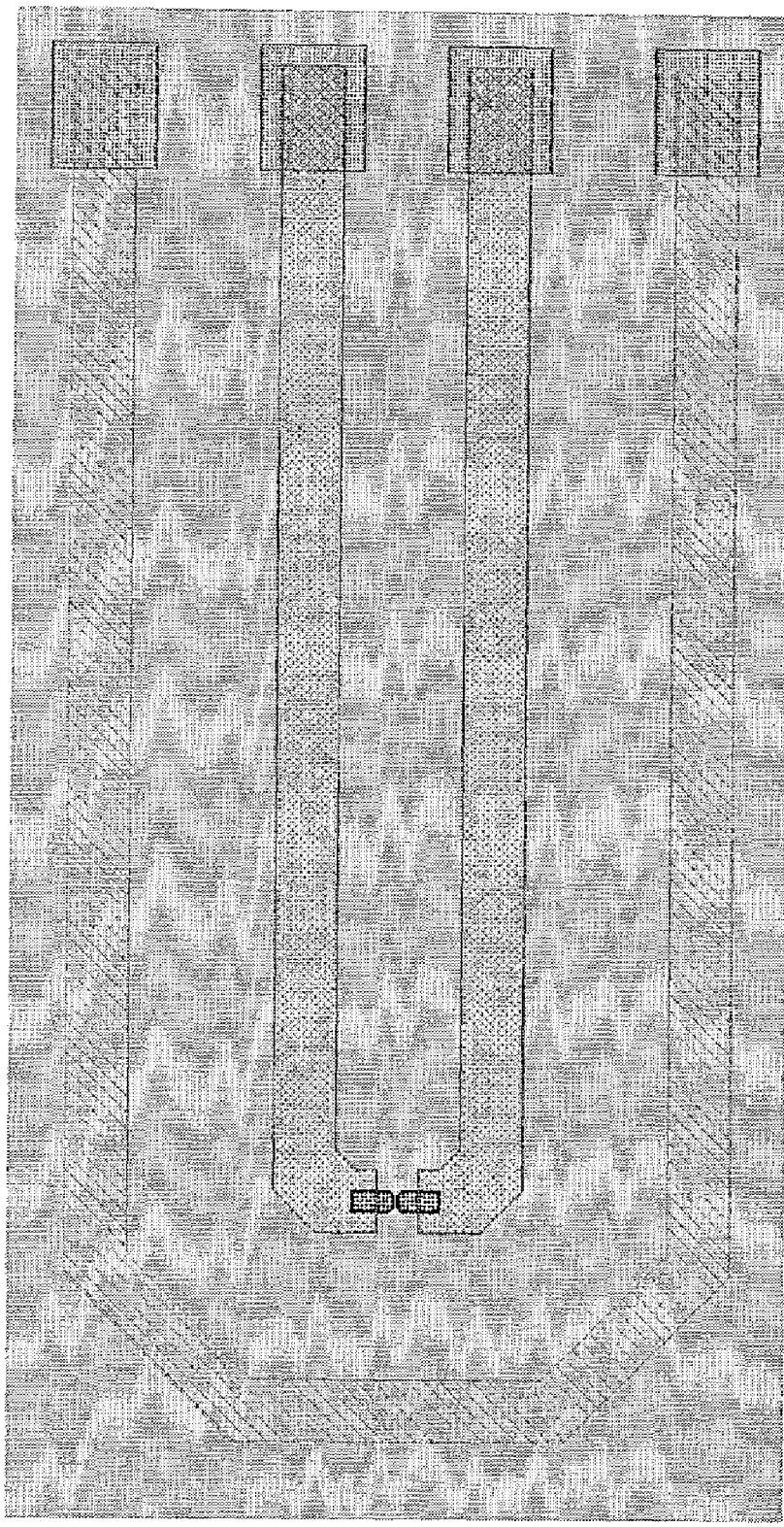
FIG. 7 illustrates a second electrode topology with two electrodes, separated by a gap, along with two traces. Guard-band/flux inducing loop is present.

FIG. 7 illustrates a second electrode topology. It comprises two electrodes and two traces. The one electrode contacts one trace and the other electrode contacts the other trace. The two traces can be substantially straight and substantially parallel, and the two traces and the two electrodes are symmetrically disposed with respect to a plane of symmetry which is perpendicular to the surface and runs through the gap between the two electrodes. The two electrodes can be separated by an electrode gap of about 2 microns or less, or one micron or less.

Figure 8:
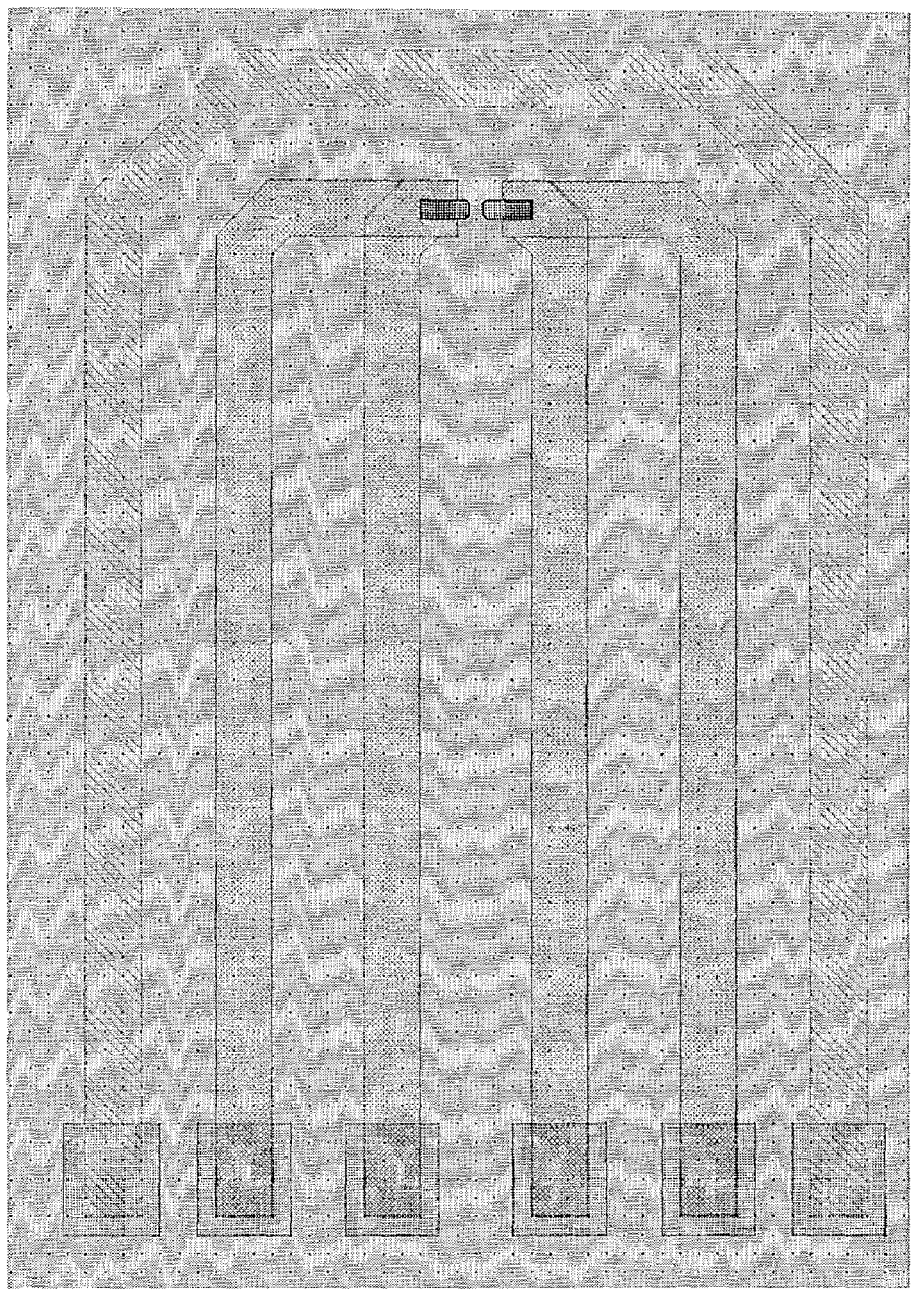
FIG. 8 illustrates a third electrode topology with two electrodes separated by a gap along with four traces. Guard-band/flux inducing loop is present.

FIG. 8 illustrates a third electrode topology. It comprises two electrodes and four traces. One electrode contacts two of the traces and the other electrode contacts the other two traces. The four traces can be substantially straight, substantially parallel, and the two electrodes and the four traces can be symmetrically disposed with respect to a plane of symmetry perpendicular to the surface which runs through the gap between the two electrodes. The two electrodes can be separated by a gap of about 2 microns or less, or about one micron or less.

Figure 9:
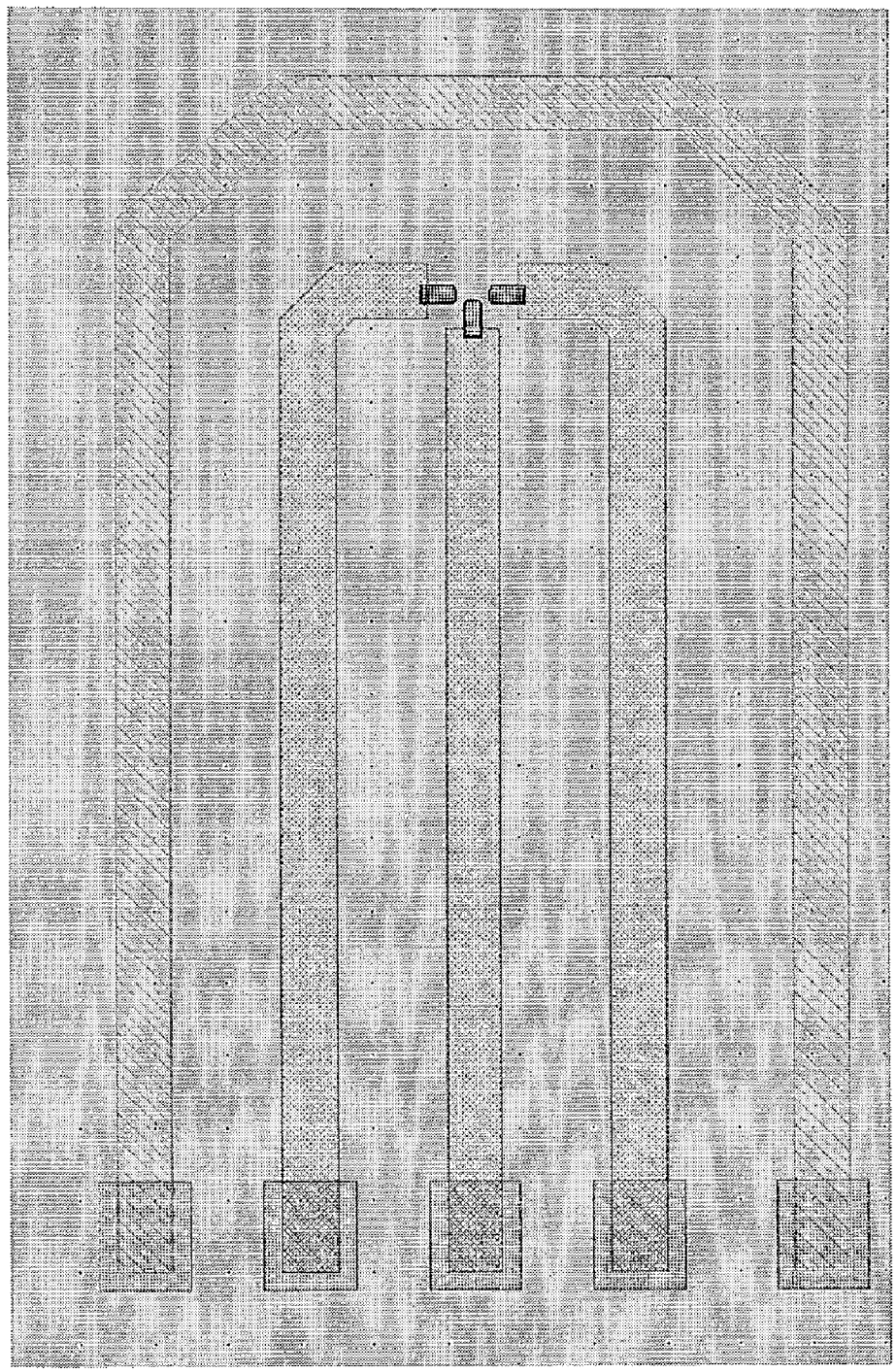
FIG. 9 illustrates a fourth electrode topology with three electrodes separated by gaps along with three traces. Guard-band/flux inducing loop is present.

FIG. 9 illustrates a fourth electrode topology. It comprises three electrodes and three traces. The first electrode contacts a first trace, a second electrode contacts a second trace, and a third electrode contacts a third trace. The three traces can be substantially straight, substantially parallel, and the outer two traces and the outer two electrodes can be symmetrically disposed with respect to a plane of symmetry which runs through the middle trace and the middle electrode. The three electrodes can be separated from each other by a gap of about 2 microns or less, or about one micron or less.

Figure 10:
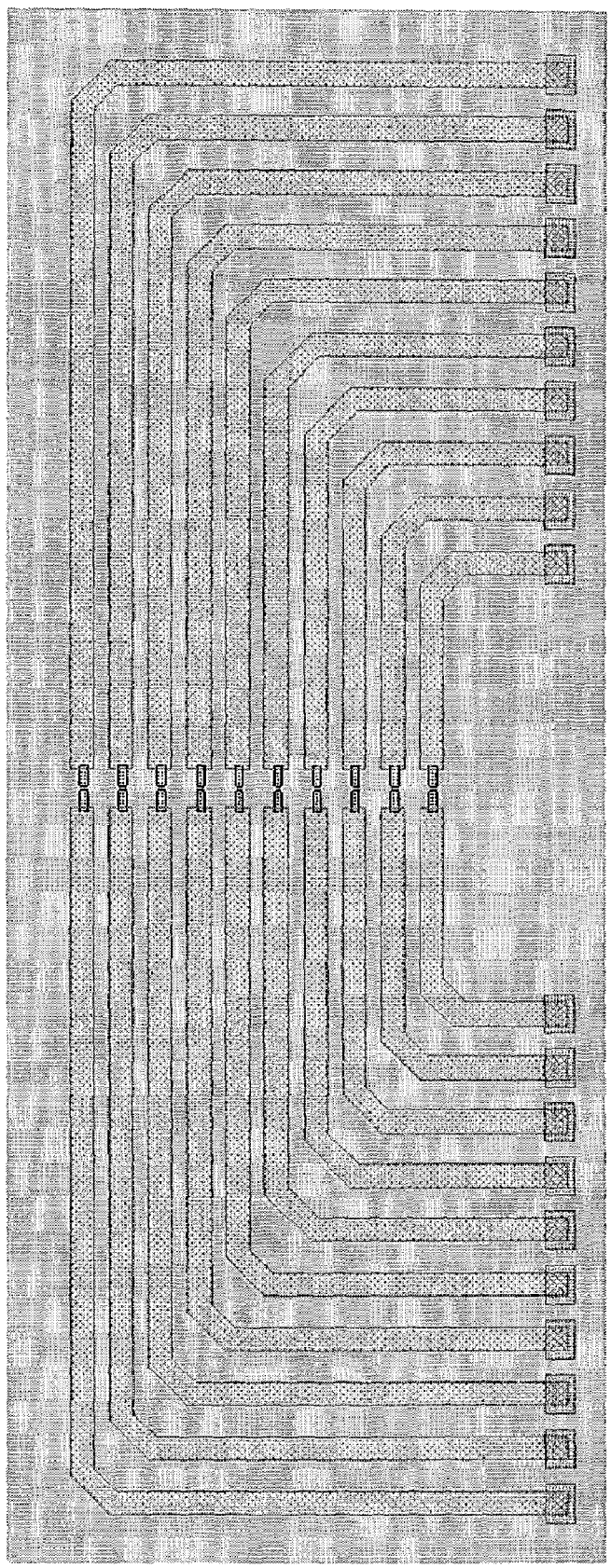
FIG. 10 illustrates a fifth electrode topology with a comb array and gap separated electrodes.

FIG. 10 illustrates a fifth electrode topology. It is a comb array comprising a plurality of paired electrodes separated by a gap, wherein the paired electrodes and separation gap can be aligned, and each electrode can be contacting a single trace. The figure shows 8 electrodes but there is no particular upper limit. The paired electrodes and the contacting wires can be symmetrically disposed with respect to a plane of symmetry perpendicular to the surface and running through the electrode gaps. The pair of electrodes can be separated by an electrode gap of about two microns or less, or about one micron or less. The distances, or pitch, between the electrodes can be matched with the distances, or pitch, between a multiple probe nanolithography head so that multiple nanostructures can be formed at once.

Figure 11:
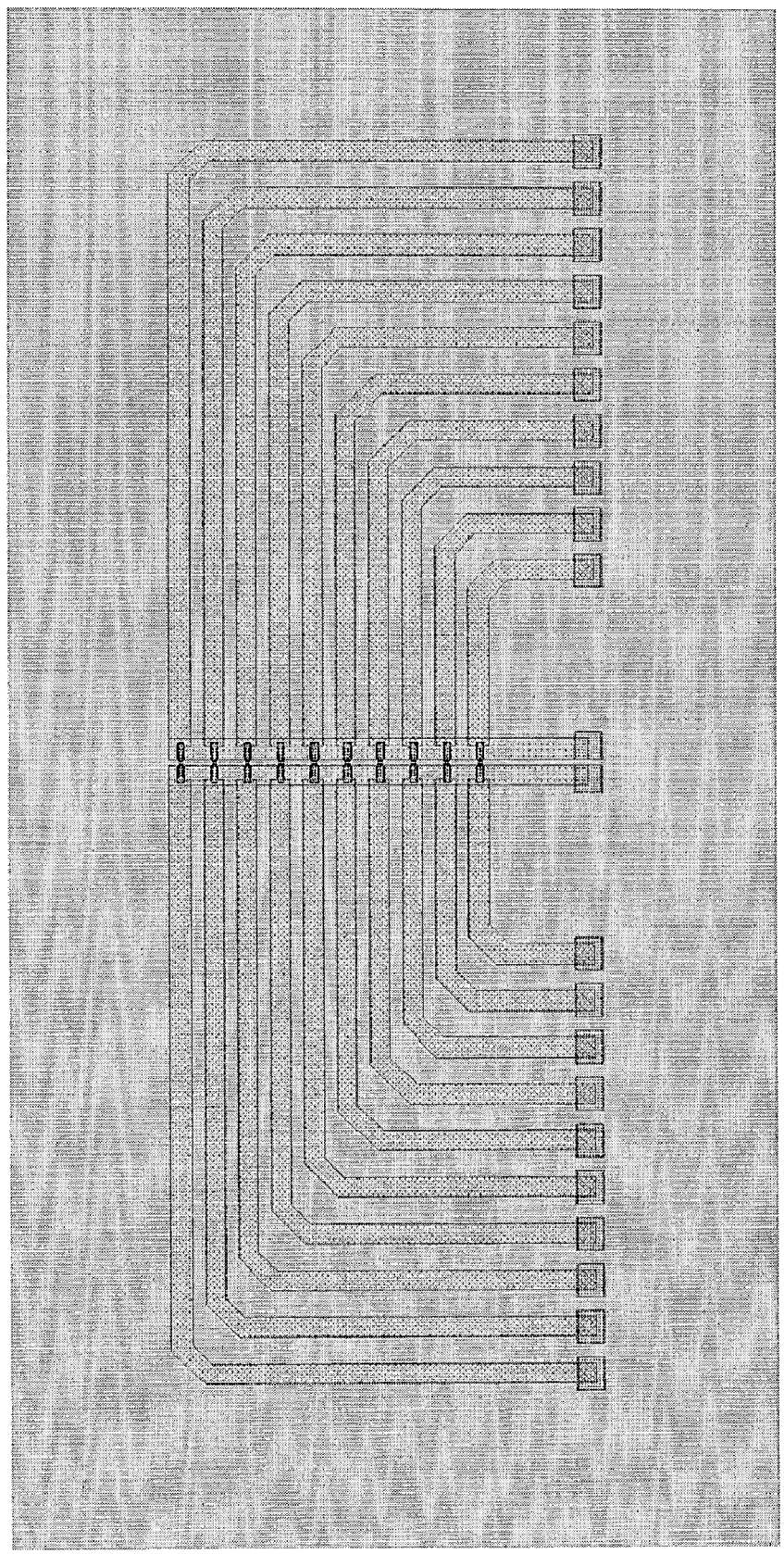
FIG. 11 illustrates a sixth electrode topology with buried electrodes.

FIG. 11 illustrates a sixth electrode topology. This is similar to the fifth electrode topology, but further includes at least two buried electrodes below the top surface underneath the surface electrodes. The two buried electrodes can be parallel. They are also connected to external bonding pads. An insulating layer is placed between the vertical electrodes and the surface electrodes. The structure is not planar but three dimensional.

Figure 12:
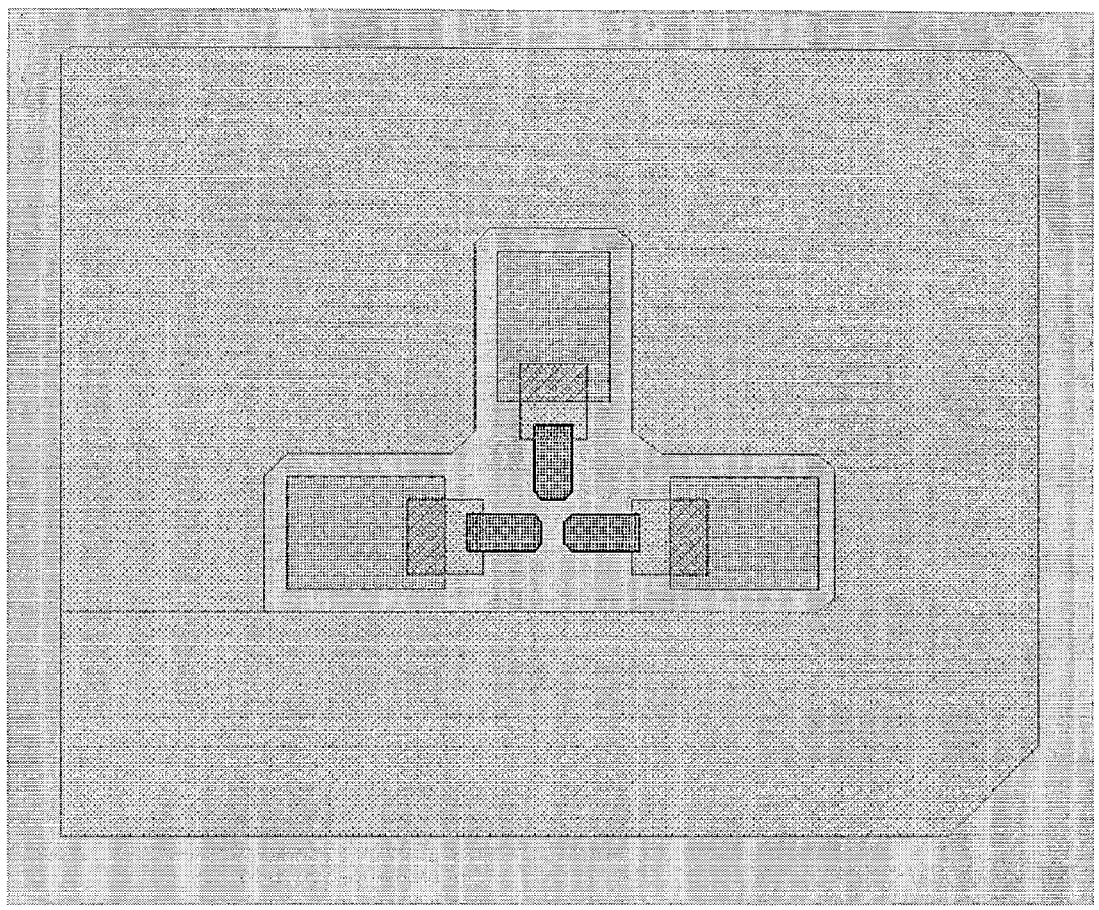
FIG. 12 illustrates a seventh electrode topology providing direct microprobe access for a three element RF microprobe access topology. The short traces and ground plane reduces the stray capacitance and enhances the ability to test the area.

FIG. 12 illustrates a seventh electrode topology. In this embodiment, the electrode topology further comprises pads which facilitate microprobe access including RF microprobe access for sensitive measurements. These are unconnected pads, not adapted for connection with the chip carrier. Three pads, for example, can be used together with short traces and the ground plane to reduce stray capacitance and enhance the ability to test the area. The gap between the electrodes can be, for example, about two microns or less, or about one micron or less.

Use of the first through sixth electrode topologies can be carried out with use of the chip carrier and CAM for testing with probes. In using the seventh electrode topology, however, the clam shell assembly and the CAM described below are not needed for probing. Rather, probing can be directly carried out on the exposed pads.

Known lithographic methods can be used to fabricate the multiple electrode topologies by, for example, photolithography on a single substrate surface. Direct write lithography can be used to prepare the protosubstrate. For example, small gap electrode topologies can be prepared by FIB.

Additional elements can be included with the substrate as desired. For example, the substrate can further comprise an active electrostatic discharge protection device. Alternatively, the protosubstrate can further comprise a passive electrostatic discharge protection device. For example, transorbs can be used.

The substrate can further comprise an embedded low noise signal amplifier embedded into the chip itself. This can greatly enhance one of the major issues of nanocircuit development which is the very small signals involved. The ability to put a well characterized micro sized low noise amplifier in very close proximity to the nanocircuit under test offers a large benefit to the developer.

The substrate can comprise fiducial markers, and the features of the electrode topology can be a measured, known offset distance from the fiducial markers. Each of the features can be numbered.

Unused area of the chip can be a flood plane and can be connected to ground. The use of flood plane ground on a chip itself is used to greatly enhance the noise immunity of the system. Electrical contact with the substrate can allow grounding of the substrate or biasing as the experimenter desires.

Figure 13:
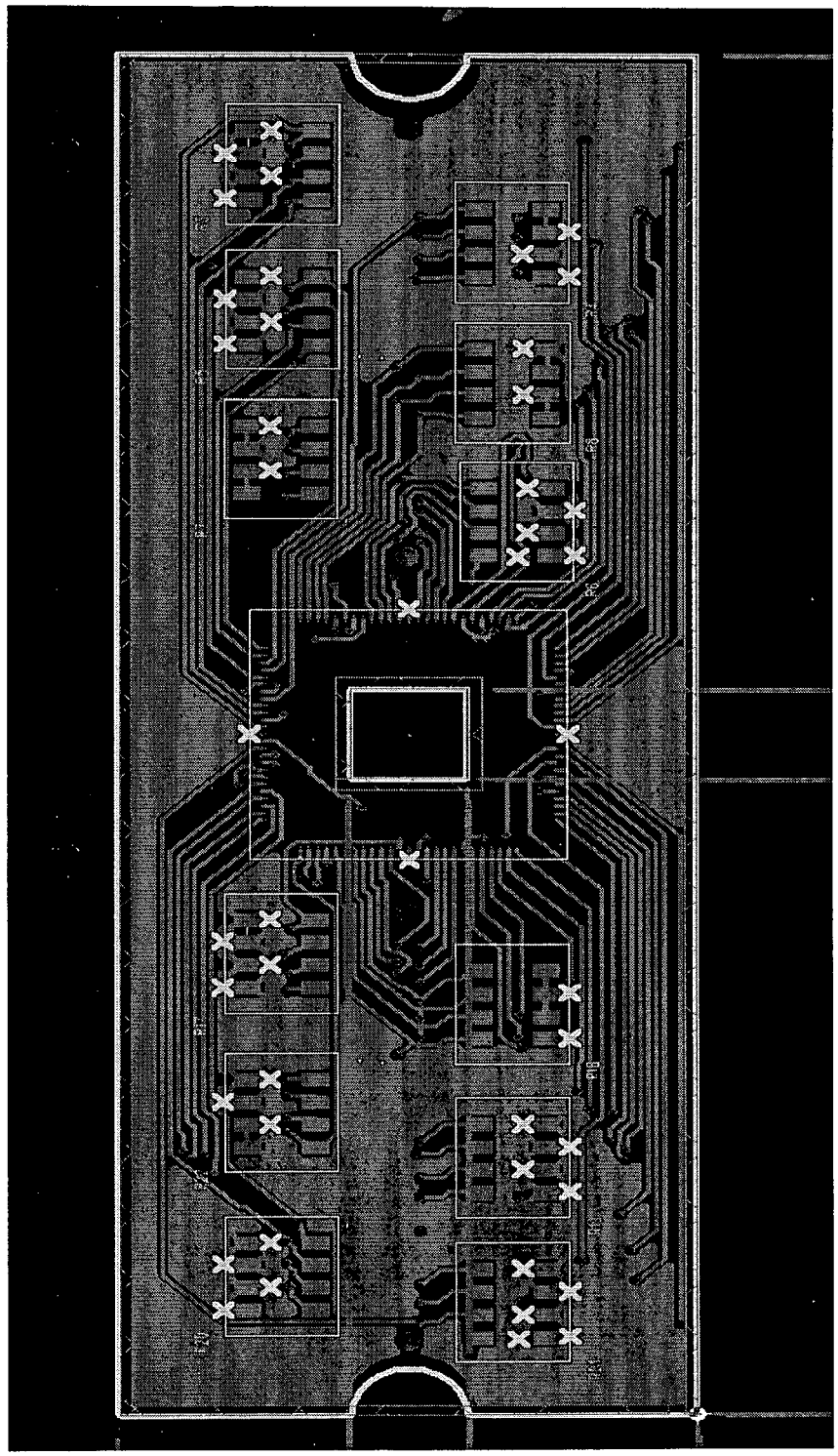
FIG. 13 illustrates the chip carrier including a central rectangular region for insertion of a protosubstrate and surrounding electronic circuitry for the chip carrier.

The chip carrier is designed for intermediate connectivity between the protosubstrate and the CAM. It can be designed with ESD protection. It can be a PCB of standard or nonstandard materials which will facilitate the signal breakout. For nanolithography with use of AFM, it will remain small enough to fit in an AFM without interfering with the AFM scan head. FIG. 13 illustrates a chip carrier, having a central rectangular region which allows for insertion of the substrate. Shunt resistors can be used on the chip carrier to control potential damage from electrostatic discharge. An external ground plane can be used to encase the chip carrier on both external layers, and the internal signal routing can be of controlled impedance traces. Because of the extremely low signal strength of most nano-circuits, low noise preamplifiers can be used in either the chip carrier or CAM described below. Known PCB manufacturing and photolithographic methods can be used to prepare the carrier chip.

The connection method between the substrate and the chip carrier is not particularly limited so long as an integrated substrate carrier assembly unit is formed. For example, wire bonding, re-flow, or soldering can be used to connect the substrate with the chip carrier. Wire bonding and chip carriers are known in the art, as discussed in for example U.S. Pat. No. 6,561,411 to Lee; U.S. Pat. No. 6,559,5123 to Schmid et al.; U.S. Pat. No. 6,555,415 to Hedler et al.; U.S. Pat. No. 6,509,207 to Liu; U.S. Pat. No. 6,452,406 to Beaman et al.; and U.S. Pat. No. 6,433,423 to Bergstedt.

Alternative methods for connecting the substrate traces to the chip carrier traces can be used. For example, electrically conductive vias can be formed through the protosubstrate wafer, and then electrical interconnects can be fabricated such as miniature solder bumps forming, for example, a ball grid array, on its bottom. For example, after fabrication of the protosubstrate patterns, the backside of a Pyrex wafer can be dry-etched with $CHF_3/O_2$ in a RF plasma reactor, until the Cr adhesion layer is reached. Chromium can be then sputtered to coat the side walls of the vias. A thick photoresist can be spun and patterned to form electrical interconnects, on the top of which a Cu/Au/Pb—Sn solder sandwich can be formed by electroplating or evaporation. The resist can be removed, the Cr primer etched back, and the wafer heated to allow for solder wetback. After dicing using a diamond saw, the protosubstrate is mounted on the chip carrier and the solder reflowed to create permanent electrical connections. Alternative methods to fabricate the electrical interconnects are known in the art (see, for example, U.S. Pat. No. 6,563,225 to Soga et al., incorporated by reference in its entirety).

Figure 14:
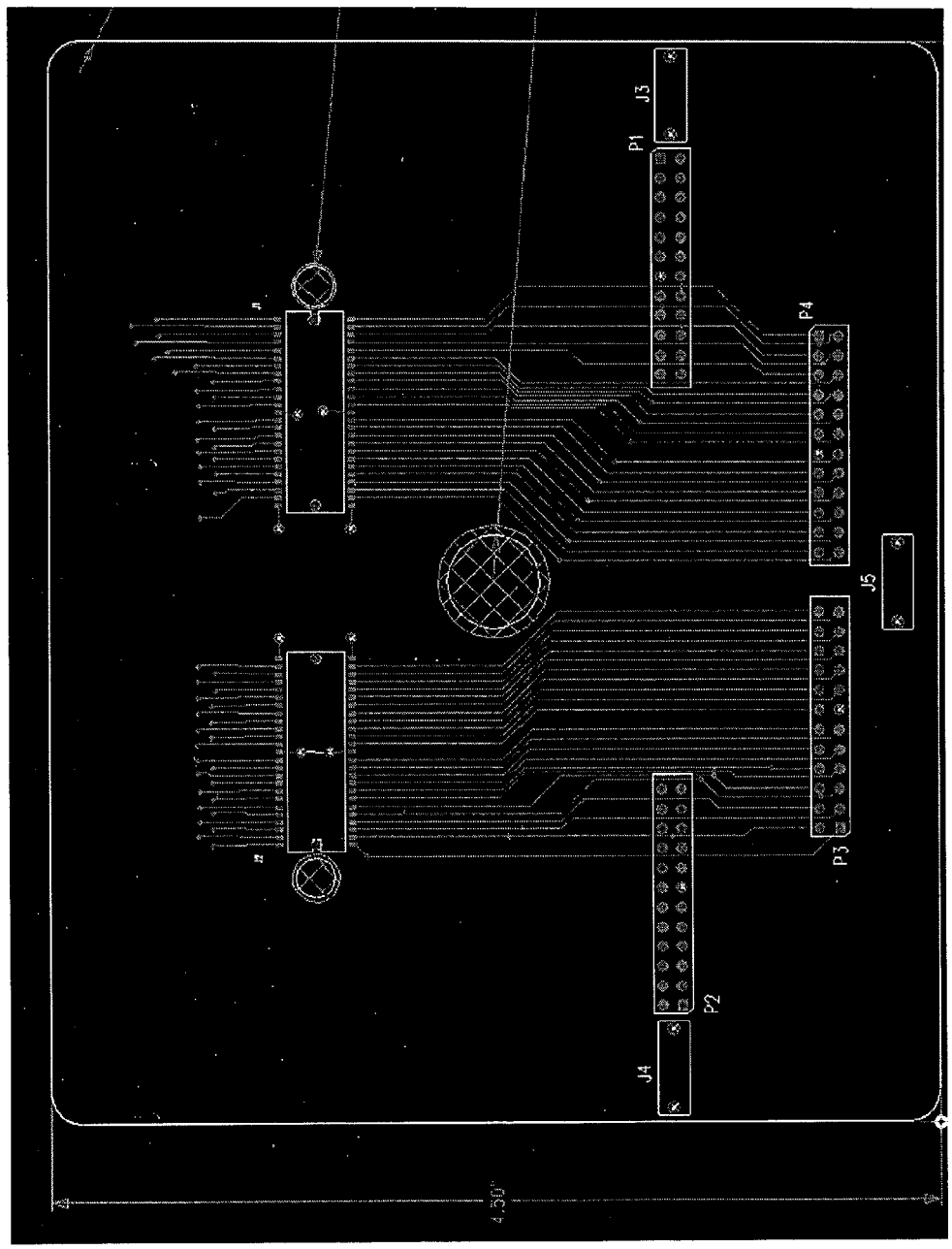
FIG. 14 illustrates electronic circuitry for the connector access module including pin connectors.

The CAM can be prepared by known PCB manufacturing methods and allows easy signal access by using standard connectors, and an embodiment is shown in FIG. 14. It serves as the standard, reusable-platform and can deliver power, test signals, and output signals for instrument measurements. The connection between the chip carrier and CAM can be a multi-pin connector or group of connectors. The chip carrier can fit directly into the CAM. An auxiliary access module can reside in the AFM, or can be connected by cable, thus allowing the experimenter to actively drive the substrate while in the AFM.

The mechanical enclosure of the CAM can be made to enclose the chip carrier entirely. The enclosure can be of a conductive material that would offer good EMI shielding when grounded. This enclosure can house Surface Acoustic Wave (SAW) devices that are under the experimenter's control and used to move a sample across the substrate. The enclosure can be made water and/or gas tight with inlet and outlet fittings which facilitate the introduction of various chemistries or absence of chemistries for in situ measurements or processes. Hinges and snaps can be included for opening and closing. Temperature control can be added to the CAM allowing thermal control of the substrate. While making electrical measurements, the temperature and magnetic field in the CAM can be modified and measured. Connections can include BNC, SMA/SMX, other standard connector types, Dual Row Header signal access, Power, and Control. In sum, the CAM has connections which allow access to the experimental areas and experimenter system control.

Figure 15:
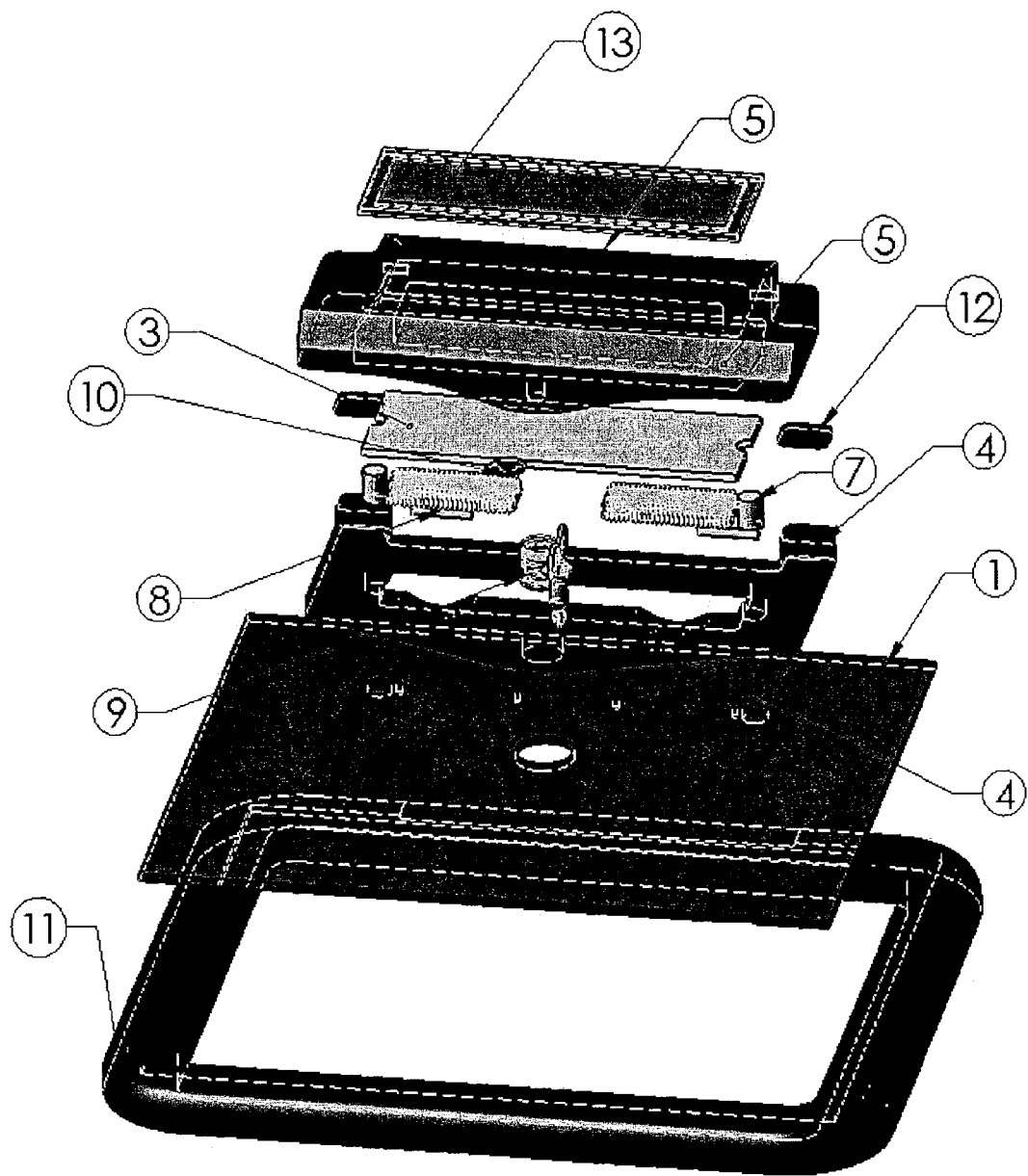
FIG. 15 illustrates an exploded view of a final assembly.
Figure 16:
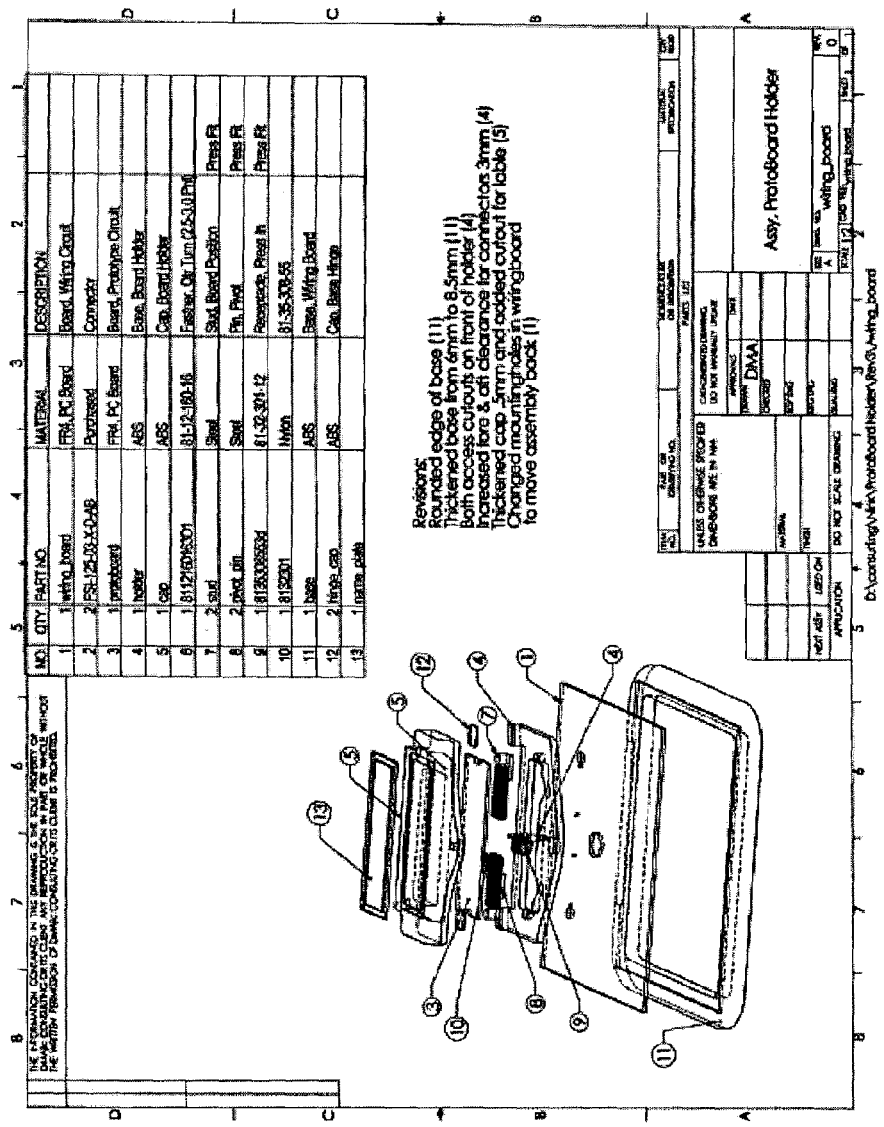
FIG. 16 illustrates an exploded view of a final assembly together with part information.
Figure 17:
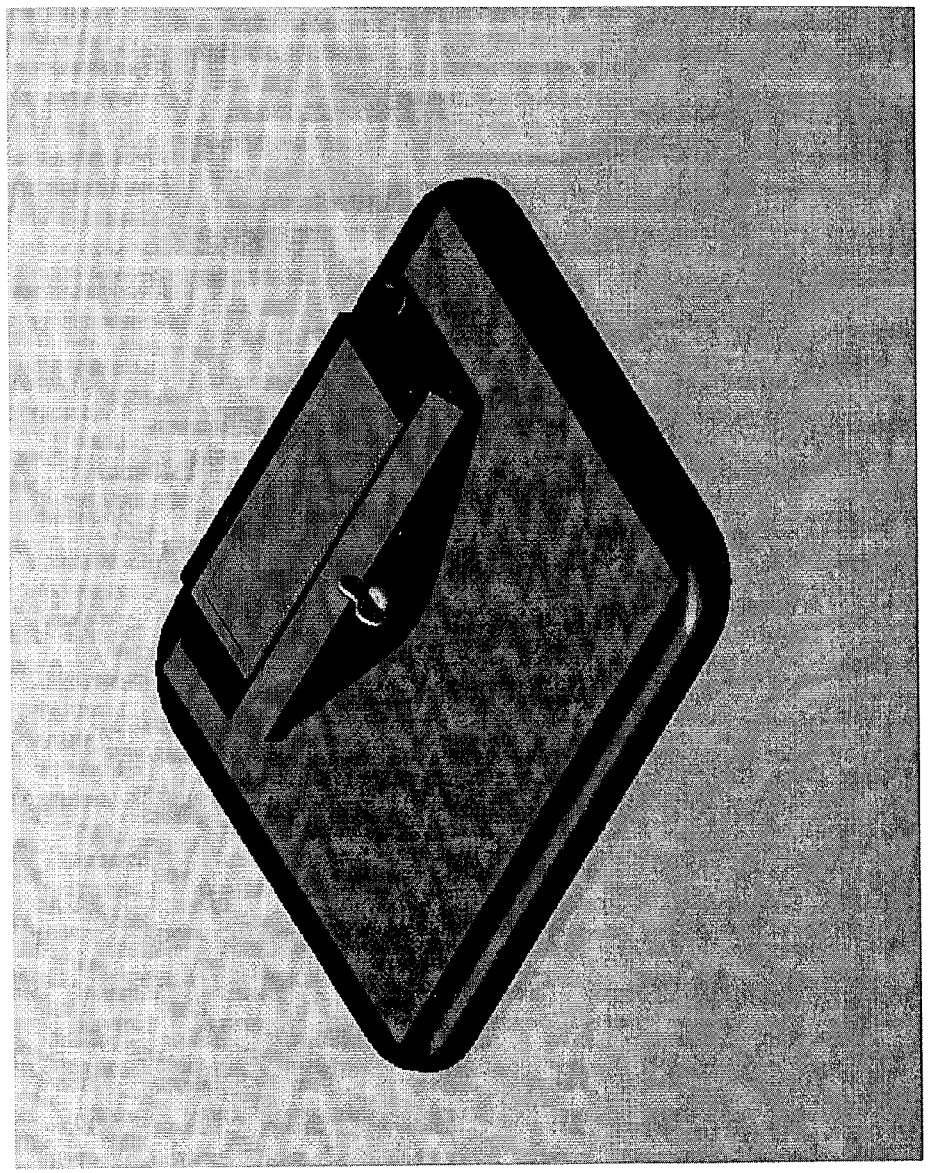
FIG. 17 illustrates a perspective view of a final clamshell assembly.
Figure 18:
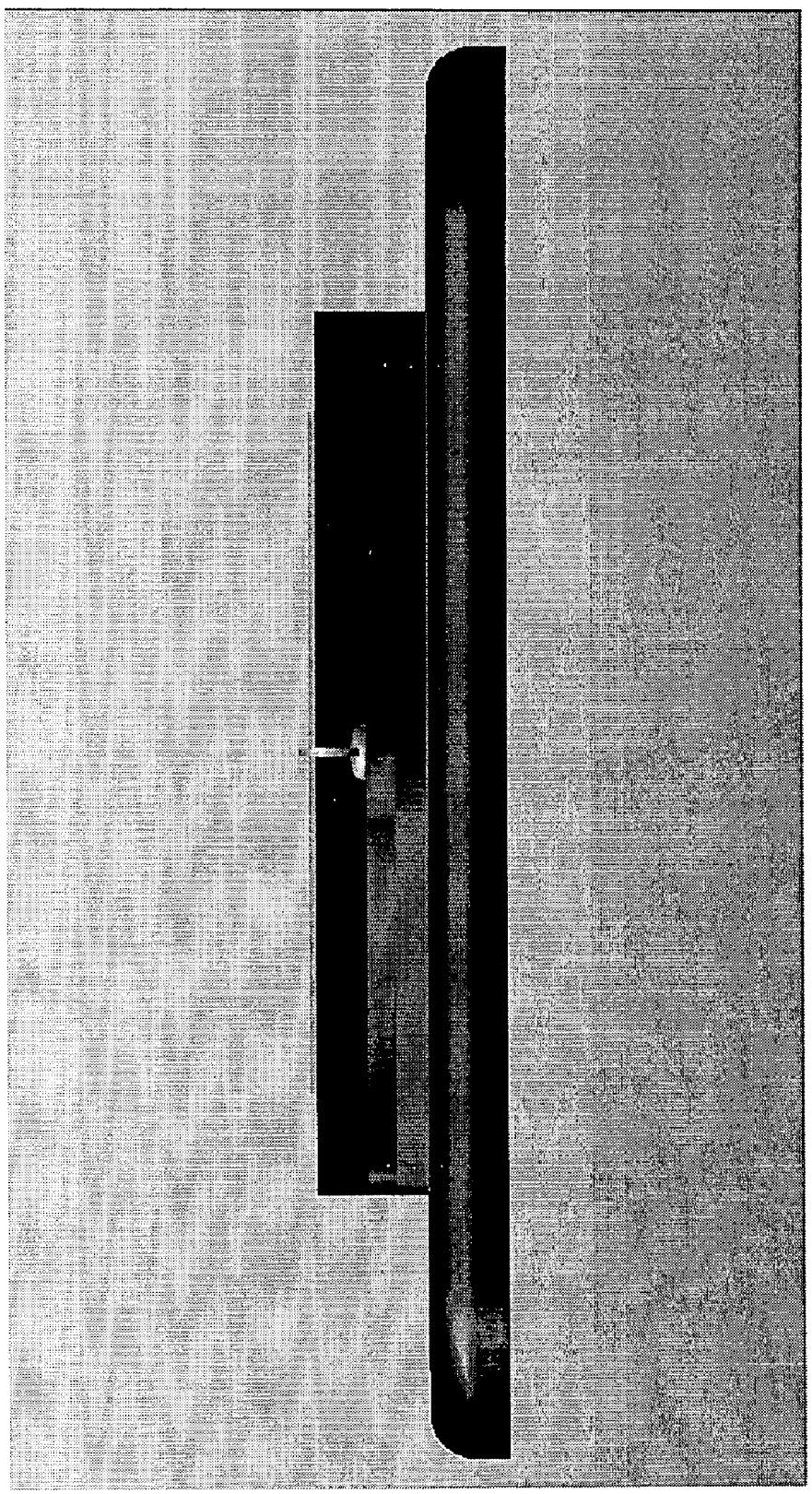
FIG. 18 illustrates a side view of a final clamshell assembly.
Figure 19:
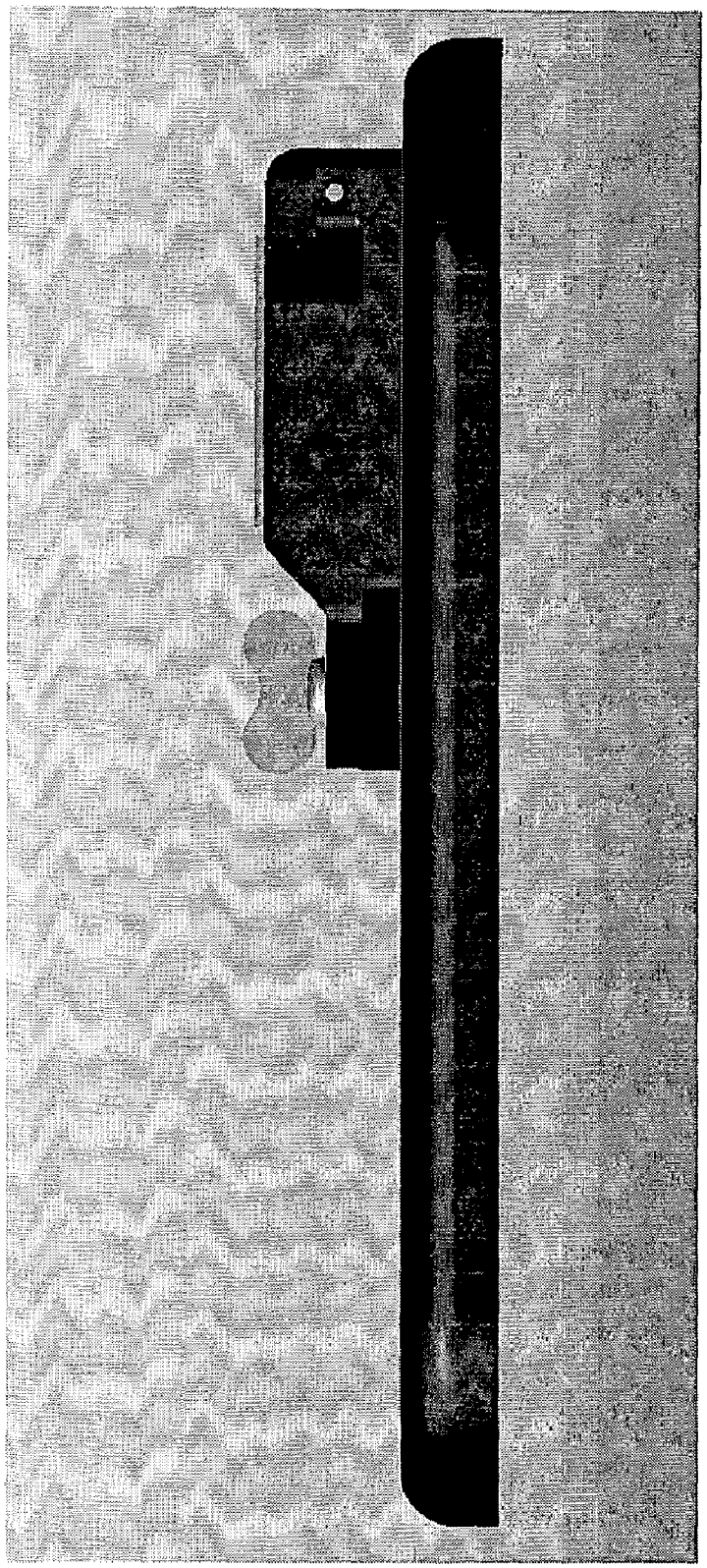
FIG. 19 illustrates a second side view of a final clamshell assembly.
Figure 20:
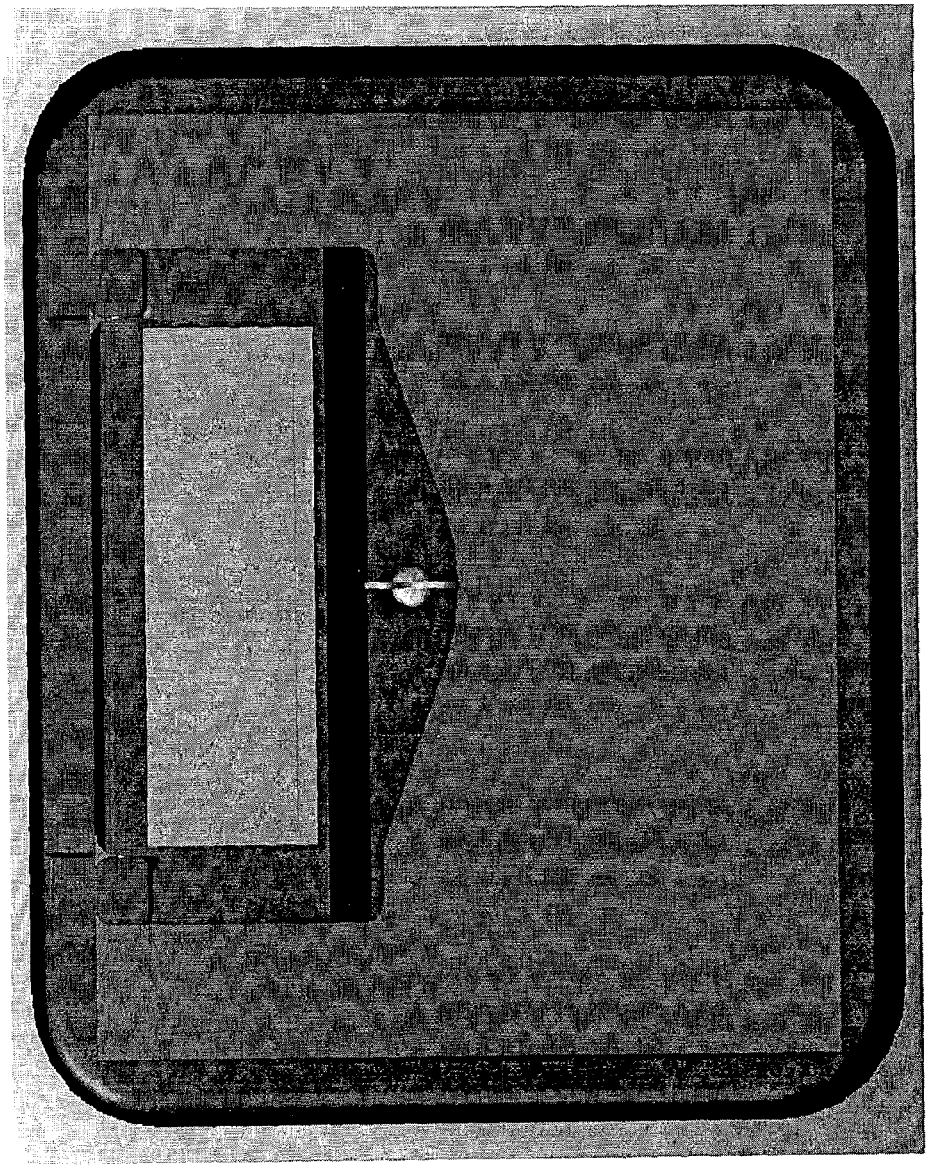
FIG. 20 illustrates a top view of a final clam shell assembly.

FIGS. 15 and 16 illustrate assembly of different elements into a final unit for testing.

A wiring circuit board 1 (FR4, PC Board) can be fitted into a wiring board base 11 (ABS), which can be a plastic piece about 4 inches×5 inches. The wiring circuit board 1 can have external pins for connections with testing devices. A board holder base 4 (ABS) then connects to the wiring circuit board 1. The chip carrier 3 (FR4, PC Board) having the protosubstrate thereon, fits into the board holder base 4. Board holder cap 5 (ABS) and name plate 13 can be used. The entire assembly fits together in a clam shell structure, with a hinge and the ability to close, lock, and open the encasement as desired. Other components include press in receptacle 9 (press fit), pivot pin 8 (press fit), nylon piece 10, board position stud 7 (steel, press fit), and base hinge cap 12 (ABS). The assembly can also comprise two single component connectors (2) which are under the chip carrier. They can be affixed to the CAM and make contact with traces on the bottom of the chip carrier. The assembly can also comprise a half-turn fastener (6) that is used to secure the clamshell in the closed position.

FIGS. 17–20 illustrate perspective, side, and top views of the fully assembled unit, comprising substrate, chip carrier, and CAM in the clam-shell configuration, in a closed position.

In another embodiment, the chip carrier comprises a chip package, such as a JEDEC- or EIAJ-style ceramic pin grid array (CPGA), Ceramic Leaded Chip Carrier or Land Grid Array (LGA). The chip package mates with a matching socket placed, for example, on the CAM printed circuit board or an auxiliary board in a nanolithography instrument. Such designs have the following advantages: (1) the chip package can be inserted into or removed from its mating socket at will; (2) the electrical and mechanical interconnections of the chip carrier to its socket are standard, facilitating its integration with commercially available chip test equipment and in current electronic designs; (3) the electrical connections between the protosubstrate pads and the chip package may be encapsulated (e.g. in epoxy), isolating them from the protosubstrate environment; (4) chip packages are available that are inert when contacted with aggressive chemicals or compatible with a use in high vacuum systems; (5) the protosubstrate mounted on a chip package may be enclosed e.g. using a commercially available lid or cover.

The protosubstrate can be adapted for direct-write lithography with use of tips to deliver a patterning compound from the tip to the protosubstrate. Nanoscopic tips can be scanning probe microscopic tips including atomic force microscopic tips.

Nanolithographic methods and nanostructures are described in the following patent applications and publications, which are hereby incorporated by reference:

1. U.S. Provisional application 60/115,133 filed Jan. 7, 1999 ("Dip Pen Nanolithography") to Mirkin et al.
2. U.S. Provisional application 60/157,633 filed Oct. 4, 1999 ("Methods Utilizing Scanning Probe Microscope Tips and Products Therefor or Produced Thereby") to Mirkin et al.
3. U.S. Regular patent application Ser. No. 09/477,997 filed Jan. 5, 2000 ("Methods Utilizing Scanning Probe Microscope Tips and Products Therefor or Produced Thereby") to Mirkin et al.
4. U.S. Provisional application 60/207,713 filed May 26, 2000 ("Methods Utilizing Scanning Probe Microscope Tips and Products Therefor or Produced Thereby") to Mirkin et al.
5. U.S. Provisional application 60/207,711 filed May 26, 2000 ("Methods Utilizing Scanning Probe Microscope Tips and Products Therefor or Produced Thereby") to Mirkin et al.
6. U.S. Regular application Ser. No. 09/866,533 filed May 24, 2001 ("Methods Utilizing Scanning Probe Microscope Tips and Products Therefor or Produced Thereby") to Mirkin et al.
7. U.S. patent publication No. 2002/0063212 A1 published May 30, 2002 ("Methods Utilizing Scanning Probe Microscope Tips and Products Therefor or Produced Thereby") to Mirkin et al.
8. U.S. patent publication No. 2002/0122873 A1 published Sep. 5, 2002 ("Nanolithography Methods and Products Produced Therefor and Produced Thereby").
9. PCT publication number WO 00/41213 A1 published Jul. 13, 2000 based on PCT application no. PCT/US00/00319 filed Jan. 7, 2000 ("Methods Utilizing Scanning Probe Microscope Tips and Products Therefor or Produced Thereby").
10. PCT publication number WO 01/91855 A1 published Dec. 6, 2001 based on PCT application no. PCT/US01/17067 filed May 25, 2001 ("Methods Utilizing Scanning Probe Microscope Tips and Products Therefor or Produced Thereby").
11. U.S. regular patent application, Ser. No. 10/366,717 to Eby et al., filed Feb. 14, 2003 ("Methods and Apparatus for Aligning Patterns on a Substrate").
12. U.S. regular patent application, Ser. No. 10/375,060 to Dupeyrat et al., filed Feb. 28, 2003 ("Nanolithographic Calibration Methods").
13. U.S. Patent Publication 2003/0068446, published Apr. 10, 2003 to Mirkin et al. ("Protein and Peptide Nanoarrays")
14. U.S. Regular patent application, Ser. No. 10/307,515 filed Dec. 2, 2002 to Mirkin et al. ("Direct-Write Nanolithographic Deposition of Nucleic Acids from Nanoscopic Tips").
15. U.S. Regular patent application, Ser. No. 10/320,721 filed Dec. 17, 2002 to Mirkin et al. ("Patterning of Solid State Features by Direct-Write Nanolithographic Printing").
16. U.S. Patent Publication 2003/0022470, published Jan. 30, 2003, Liu et al. ("Parallel, Individually Addressible Probes for Nanolithography").
17. U.S. Patent Publication 2003/0007242, published Jan. 9, 2003 to Schwartz ("Enhanced Scanning Probe Microscope and Nanolithographic Methods Using Same").
18. U.S. Patent Publication 2003/0005755, published Jan. 9, 2003 to Schwartz ("Enhanced Scanning Probe Microscope").

Protosubstrates can be tailored specifically for a variety of different nanotechnology application fields including, for example, nanoelectronics, biomedical experiments, and bioelectronic experiments. For nanoelectronics, it can be a general purpose substrate.

External electrical devices are well-known in the art.

Probes are also known in the art, as discussed in, for example, U.S. Pat. No. 6,452,406 to Beaman et al.

Probes, chip carriers, and external devices are known in the art and are described, for example, in the following U.S. Pat. No.: 4,833,404 to Meyer et al.; U.S. Pat. No. 4,862,076 to Renner; U.S. Pat. No. 4,949,453 Neumann; U.S. Pat. Nos. 4,978,912; 5,122,620; 5,226,824; RE 34,395, 5,258,576; 6,043,563; and 6,215,196.

The invention can be used to facilitate the fabrication and testing of nanodevices via, for example, DPN printing, but also can be used with a variety of other (nano)lithography techniques such as, for example, stamping and molding methods and electron beam lithography. It can be used for a variety of nanodevices (e.g., quantum dots, nanowires, nanoscale switching devices, few-electron devices, nanosensors, nanoelectrodes, and nanotube-based devices) in a variety of testing and excitation scenarios.

The protosubstrate is an example of using a combination of lithography techniques, including photolithography and direct-write lithography, to fabricate functional devices. The protosubstrate also serves as an example of integrating commercially available CAD designs with direct-write lithographic software and hardware, including DPNWrite software (NanoInk, Chicago, Ill.) designed to pattern compounds onto substrates with nanoscopic tips. The protosubstrate can be designed using commercially available CAD software, and the design can be exported to a GDS II format file. The GDS II format file can then be imported into, for example, DPNWrite software (NanoInk, Chicago, Ill.). Nanocircuit patterns can be then designed to interconnect to the traces and the DPNWrite software can be used to fabricate directly the nanocircuit patterns on the protosubstrate. Alternatively, the protosubstrate can be imaged with the SPM and new circuit elements designed and aligned directly with the imaged structures prior to fabrication.

The present invention, therefore, provides a description of systems and methods for combining two or more lithography techniques, including nanolithography methods, such as e-beam direct writing (EBDW), focused ion beam (FIB) and probe-based nanolithographies, such as DIP PEN NANO- LITHOGRAPHY™ (DPN™) printing (proprietary marks of NanoInk, Inc., Chicago, Ill., providing consulting, products, and services related to nanolithography) and scanning tunneling microscopy (STM)-based nanolithographies, as well as micron-level lithography methods, such as conventional optical lithography.

Systems and methods consistent with the present invention include (1) software and/or hardware that allows the design and alignment of patterns to be fabricated with different lithography equipment and techniques, which may be of very different characteristic scale, in a uniform and integrated manner; and (2) hardware and/or software (which can be part of or separate from that of item 1), which enables the sequential or parallel control of several (types of) instruments and therefore, the fabrication of ditto patterns, in an integrated and uniform manner.

The software and/or hardware can include, among other possible embodiments, a device driver communicating with a graphic user interface through an application programming interface (API) and transmitting commands and messages to and from the instruments through several interface, such as a RS-232 link, a TCP-IP or UDP-IP connection on an Ethernet network or similar communication means, or a GPIB, Firewire or USB connection.

Examples of instruments include, but are not limited to, probe nanomanipulators, such as an atomic force microscope (AFM), a scanning tunneling microscope, or a tool dedicated to nanolithography, such as the Nanoink DPN-writer P100 and its successors, (available from NanoInk, Inc., Chicago, Ill.) and electron- or ion-based lithography means, such as scanning electron microscopes (SEM), (scanning) transmission electron microscopes, and focused ion beam mills, including the tools branded by Raith, LEO, Jeol, Hitachi, FEI and Veeco. The instruments can also include micron level lithographic devices, such as conventional optical lithography devices.

The invention also applies to instrument add-ons, such as electron beam pinching devices, translational or rotational high-resolution stages, as well as other or similar auxiliary equipment.

An advantage of the invention is that the electrode topology can be prepared with use of computer aided design lithography software which can be integrated with the additional software for conducting the nanolithography.

What is claimed is:

1. A nanolithographic protosubstrate adapted for nanolithographic formation of nanostructures on the protosubstrate, comprising:
    a substrate having a top surface exposed for nanolithographic formation of nanostructures, wherein the top surface comprises:
    electrically insulating surface regions; and
    at least one discreet electrode topology surrounded by the electrically insulating surface regions,
    wherein the electrode topology is adapted with electrical interconnections for electrically coupling the electrode topology to an external device, and
    wherein the nanolithographic protosubstrate is adapted for mounting to a chip carrier and also is adapted for direct-write nanolithography, and
    wherein the protosubstrate is anchored to the chip carrier to form a substrate carrier assembly, and the substrate carrier assembly is adapted for connection to a connector access module.

2. The protosubstrate according to claim 1, wherein the electrically conductive surface regions are substantially flat and coplanar with each other, and the electrically insulating surface regions are also substantially flat and coplanar with each other.

3. The protosubstrate according to claim 2, wherein the substantially flat and coplanar electrically conductive surface regions are higher than the substantially flat and coplanar electrically insulating surface regions.

4. The protosubstrate according to claim 2, wherein the substantially flat and coplanar electrically conductive surface regions are lower than the substantially flat and coplanar electrically insulating surface regions.

5. The protosubstrate according to claim 3, wherein the electrically conductive surface regions are about 100 nm or less in height above the electrically insulating surface regions.

6. The protosubstrate according to claim 3, wherein the electrically conductive surface regions are about 10 nm or less in height above the electrically insulating surface regions.

7. The protosubstrate according to claim 1, wherein the electrically conductive surface regions and the electrically insulating surface regions are substantially coplanarized.

8. The protosubstrate according to claim 1, wherein the electrically conductive surface regions and the electrically insulating surface regions are substantially coplanarized by chemical mechanical polishing.

9. The proto substrate according to claim 1, wherein the electrically conductive surface regions are metallic and the electrically insulating surface regions are metal oxide.

10. The protosubstrate according to claim 1, wherein the electrically conductive surface regions are gold and the electrically insulating surface regions are silicon dioxide.

11. The protosubstrate according to claim 1, wherein the electrode topology comprises a single electrode with two traces.

12. The protosubstrate according to claim 11, wherein one trace is adapted for sensing and the other trace is adapted for an active bias.

13. The protosubstrate according to claim 11, wherein the two traces are substantially straight, substantially parallel, and symmetrically disposed with respect to a plane of symmetry which is perpendicular to the top surface and which intersects the electrode.

14. The protosubstrate according to claim 1, wherein the electrode topology comprises two electrodes and two traces, one electrode contacting one trace and the other electrode contacting the other trace.

15. The proto substrate according to claim 14, wherein the two electrodes are separated by an electrode gap of about 2 microns or less.

16. The proto substrate according to claim 15, wherein the two traces are substantially straight, substantially parallel, and the two traces and the two electrodes are symmetrically disposed with respect to a plane of symmetry which is perpendicular to the surface and runs through the gap between the two electrodes.

17. The proto substrate according to claim 1, wherein the electrode topology comprises two electrodes and four traces, one electrode contacting two of the traces and the other electrode contacting the other remaining two traces.

18. The protosubstrate according to claim 17, wherein the two electrodes are separated by a gap of about 2 microns or less.

19. The proto substrate according to claim 17, wherein the four traces are substantially straight, substantially parallel, and the two electrodes and the four traces are symmetrically disposed with respect to a plane of symmetry perpendicular to the surface which runs through the gap between the two electrodes.

20. The protosubstrate according to claim 1, wherein the electrode topology comprises three electrodes and three traces, a first electrode contacting a first trace, a second electrode contacting a second trace, and a third electrode contacting a third trace.

21. The protosubstrate according to claim 20, wherein the three electrodes are each separated from each other by a gap of about 2 microns or less.

22. The protosubstrate according to claim 1, wherein the three traces are substantially straight, substantially parallel, and the outer two traces and the outer two electrodes are symmetrically disposed with respect to a plane of symmetry which runs through the middle trace and the middle electrode.

23. The proto substrate according to claim 1, wherein the electrode topology comprises a comb array comprising a plurality of paired electrodes separated by a gap, the paired electrodes and separation gap are aligned, and each electrode is contacting a single trace.

24. The protosubstrate according to claim 23, wherein each pair of electrodes is separated by an electrode gap of about 2 microns or less.

25. The protosubstrate according to claim 24, wherein the paired electrodes, and the contacting single traces, are symmetrically disposed with respect to a plane of symmetry perpendicular to the surface and running through the electrode gaps.

26. The protosubstrate according to claim 23, wherein the protoboard substrate further comprises at least two buried electrodes below the top surface, buried below the electrodes.

27. The protosubstrate according to claim 26, wherein the two buried electrodes are parallel.

28. The protosubstrate according to claim 1, wherein the electrode topology comprises electrodes which are elongated having a length and a width, and the width is about 5 microns or less and the length is about 15 microns or less.

29. The protosubstrate according to claim 1, wherein the electrode topology comprises traces about 110 microns in one dimension or less.

30. The protosubstrate according to claim 1, wherein the electrode topology further comprise electrically conducting pads adapted for electrical coupling of the electrode topology with matching connectors of a printed circuit board.

31. The proto substrate according to claim 30, wherein all of the conducting pads are disposed near an outer edge of the substrate.

32. The protosubstrate according to claim 1, wherein the electrode topology is adapted with vias that connect to electrical interconnections on the bottom of the protosubstrate for electrically coupling the electrode topology to an external device.

33. The proto substrate according to claim 1, wherein the electrical interconnects are solder bumps forming a ball grid array.

34. The protosubstrate according to claim 1, further comprising at least one guard-band/flux inducing loop.

35. The proto substrate according to claim 1, wherein the protosubstrate comprises an active electrostatic discharge protection device.

36. The protosubstrate according to claim 1, wherein the protosubstrate comprises a passive electrostatic discharge protection device.

37. The protosubstrate according to claim 1, wherein the electrode topology comprises electrode gaps of about 1 microns or less.

38. The protosubstrate according to claim 1, wherein the protosubstrate comprises an embedded low noise signal amplifier.

39. The protosubstrate according to claim 1, wherein the electrode topology further comprises pads which facilitate direct microprobe access without use of the electrical interconnections.

40. The protosubstrate according to claim 1, comprising at least 7 discreet electrode topologies on the protosubstrate base.

41. The protosubstrate according to claim 1, comprising at least 30 discreet electrode topologies on the protosubstrate base.

42. The protosubstrate according to claim 1, wherein the nanolithographic protosubstrate is adapted for direct-write nanolithography with use of nanoscopic tips to deliver a patterning compound from the tip to the nanolithographic protosubstrate.

43. The protosubstrate according to claim 42, wherein the nanoscopic tips are scanning probe microscopic tips.

44. The protosubstrate according to claim 42, wherein the nanoscopic tips are atomic force microscopic tips.

45. The protosubstrate according to claim 1, wherein the substrate further comprises fiducial markers.

46. The protosubstrate according to claim 1, wherein the electrode topology is surrounded by a flood plane connected to ground.

47. The protosubstrate according to claim 1, wherein the substrate is prepared by photolithography, direct-write lithography, or a combination thereof.

48. The protosubstrate according to claim 1, wherein the chip carrier forms an electrical connection by wire bonding.

49. The protosubstrate according to claim 1, wherein the chip carrier is a printed circuit board.

50. The protosubstrate according to claim 1, wherein the chip carrier comprises metallic pads for electrical and mechanical connection to the protosubstrate.

51. The protosubstrate according to claim 1, wherein the chip carrier comprises a shunt to ground on each externally accessible signal trace.

52. The protosubstrate according to claim 1, wherein the chip carrier includes a chip package.

53. The protosubstrate according to claim 52, wherein the chip package is a Ceramic Pin Grid Array, a Ceramic Leaded Chip Carrier, or a Land Grid Array.

54. The protosubstrate according to claim 1, wherein the chip carrier comprises low noise preamplifiers.

55. The protosubstrate according to claim 7, comprising at least 30 discreet electrode topologies on the protosubstrate base.

56. The protosubstrate according to claim 55, wherein the discreet electrode topologies comprise electrodes and traces symmetrically disposed.

* * * * *

UNITED STATES PATENT AND TRADEMARK OFFICE
CERTIFICATE OF CORRECTION

PATENT NO.         : 7,199,305 B2
APPLICATION NO. : 10/444061
DATED                : April 3, 2007
INVENTOR(S)       : Cruchon-Dupeyrat It is certified that error appears in the above-identified patent and that said Letters Patent is hereby corrected as shown below:

On the cover page,

Item [*] Notice: Subject to any disclaimer, the term of this patent is extended or adjusted under 35 USC 154(b) by (163) days Delete the phrase "by 163 days" and insert -- by 253 days --

Signed and Sealed this

Twenty-ninth Day of April, 2008

JON W. DUDAS
*Director of the United States Patent and Trademark Office*